(12) United States Patent
Lee et al.

(10) Patent No.: US 11,437,555 B2
(45) Date of Patent: Sep. 6, 2022

(54) SEMICONDUCTOR DEVICE

(71) Applicant: SUZHOU LEKIN SEMICONDUCTOR CO., LTD., Taicang (CN)

(72) Inventors: Dae Hee Lee, Seoul (KR); Young Hoon Kim, Seoul (KR); Young Kyu Jeong, Seoul (KR)

(73) Assignee: SUZHOU LEKIN SEMICONDUCTOR CO., LTD., Suzhou (CN)

( * ) Notice: Subject to any disclaimer, the term of this patent is extended or adjusted under 35 U.S.C. 154(b) by 44 days.

(21) Appl. No.: 16/977,921

(22) PCT Filed: Mar. 22, 2019

(86) PCT No.: PCT/KR2019/003347
§ 371 (c)(1),
(2) Date: Sep. 3, 2020

(87) PCT Pub. No.: WO2019/194437
PCT Pub. Date: Oct. 10, 2019

(65) Prior Publication Data
US 2021/0083161 A1    Mar. 18, 2021

(30) Foreign Application Priority Data

Apr. 4, 2018 (KR) .................. 10-2018-0039193

(51) Int. Cl.
*H01L 33/62* (2010.01)
(52) U.S. Cl.
CPC .................... *H01L 33/62* (2013.01)
(58) Field of Classification Search
CPC ......... H01L 33/62; H01L 33/38; H01L 33/48; H01L 33/483
See application file for complete search history.

(56) References Cited

U.S. PATENT DOCUMENTS 11,264,540 B2 * 3/2022 Lee .................. H01L 33/382
2009/0309493 A1 12/2009 Seo
(Continued)

FOREIGN PATENT DOCUMENTS

JP        2010-074008      4/2010
KR    10-2009-0129135     12/2009
(Continued)

OTHER PUBLICATIONS

International Search Report dated Jun. 27, 2019 issued in Application No. PCT/KR2019/003347.

*Primary Examiner* — Victor A Mandala
(74) *Attorney, Agent, or Firm* — Birch, Stewart, Kolasch & Birch, LLP

(57) ABSTRACT

An embodiment provides a semiconductor device comprising: a substrate; a semiconductor structure disposed on the substrate and including a first conductive semiconductor layer, a second conductive semiconductor layer, and an activation layer disposed between the first conductive semiconductor layer and the second conductive semiconductor layer; a bonding layer disposed between the semiconductor structure and the substrate; a cover layer disposed between the bonding layer and the semiconductor structure; and an electrode pad disposed on the cover layer and spaced apart from the semiconductor structure, wherein: the semiconductor structure further comprises a stepped portion at which the lateral surface of the second conductive semiconductor layer, the lateral surface of the activation layer, and the lower surface of the first conductive semiconductor layer are exposed; the stepped portion is disposed at the outer portion of the semiconductor structure; and the cover layer is disposed to extend from a region vertically overlapping the electrode pad to a region vertically overlapping a part of the (Continued)

exposed lower surface of the first conductive semiconductor layer.

20 Claims, 14 Drawing Sheets

(56) References Cited

U.S. PATENT DOCUMENTS

| | | | |
|---|---|---|---|
| 2010/0072501 A1 | 3/2010 | Wakai et al. | |
| 2017/0025566 A1* | 1/2017 | Song | H01L 33/382 |
| 2017/0125738 A1 | 5/2017 | Kim et al. | |
| 2018/0062025 A1* | 3/2018 | Muramoto | H01L 24/94 |
| 2018/0076355 A1* | 3/2018 | Hayashi | H01L 33/62 |
| 2018/0130924 A1* | 5/2018 | Ko | H01L 33/22 |
| 2018/0240940 A1* | 8/2018 | Lee | H01L 33/46 |
| 2019/0189596 A1* | 6/2019 | Chae | H01L 33/08 |
| 2019/0206927 A1* | 7/2019 | Lee | H01L 27/153 |

FOREIGN PATENT DOCUMENTS

| | | |
|---|---|---|
| KR | 10-2013-0138483 | 12/2013 |
| KR | 10-2017-0028546 | 3/2017 |
| KR | 10-2017-0052467 | 5/2017 |

* cited by examiner

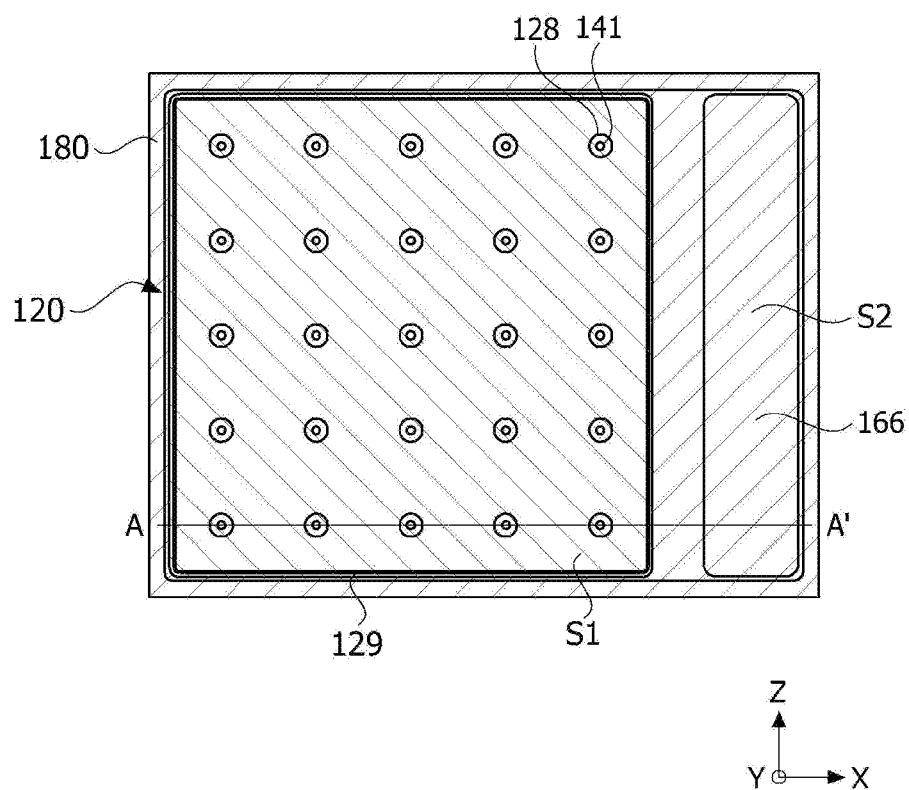
[FIG. 1]

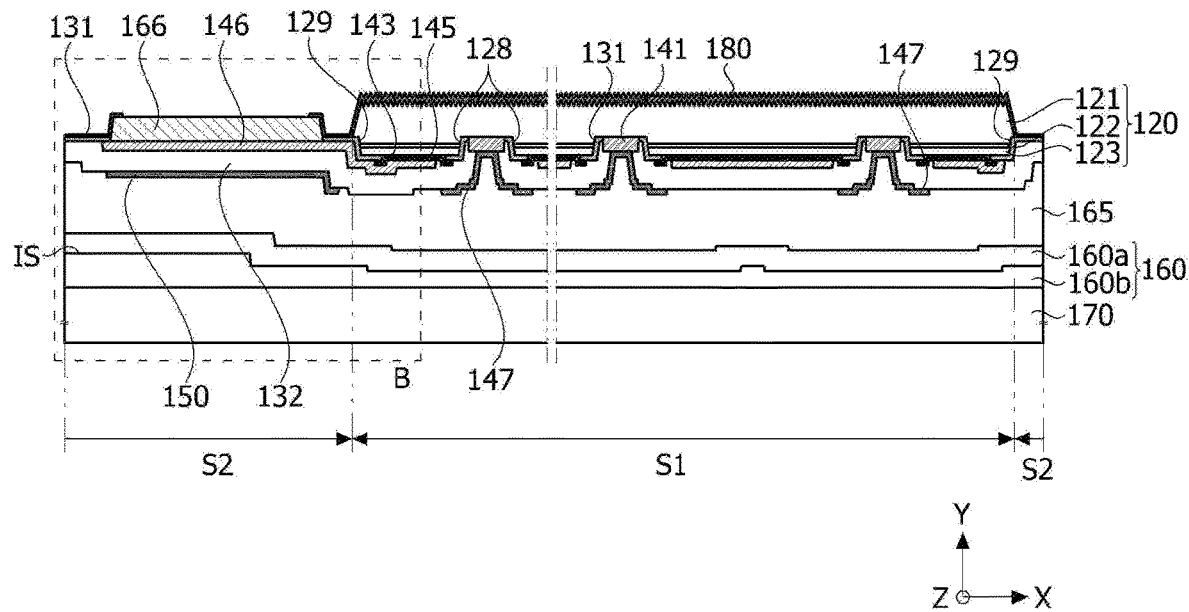
[FIG. 2]

[FIG. 3]
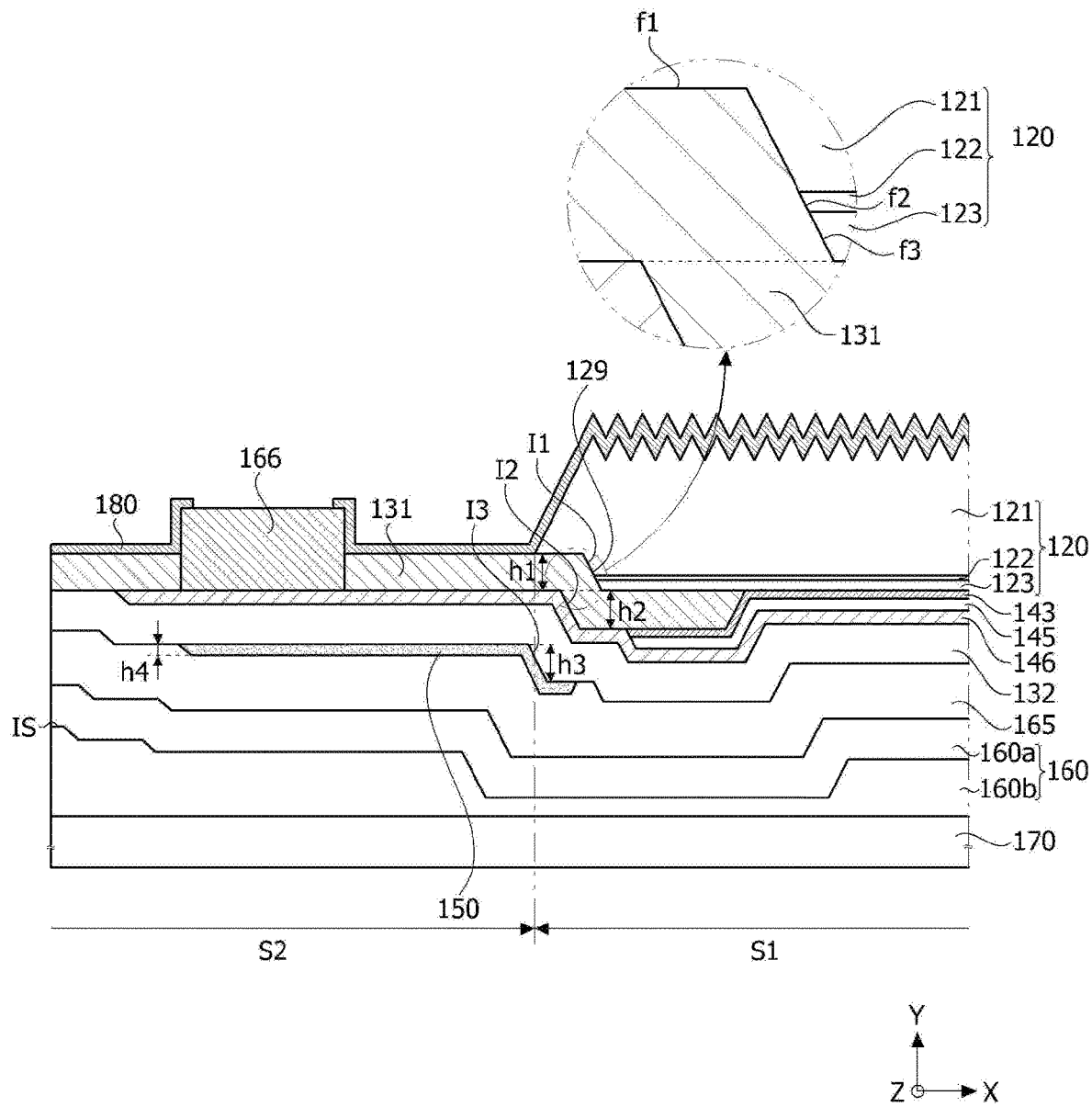

[FIG. 4]
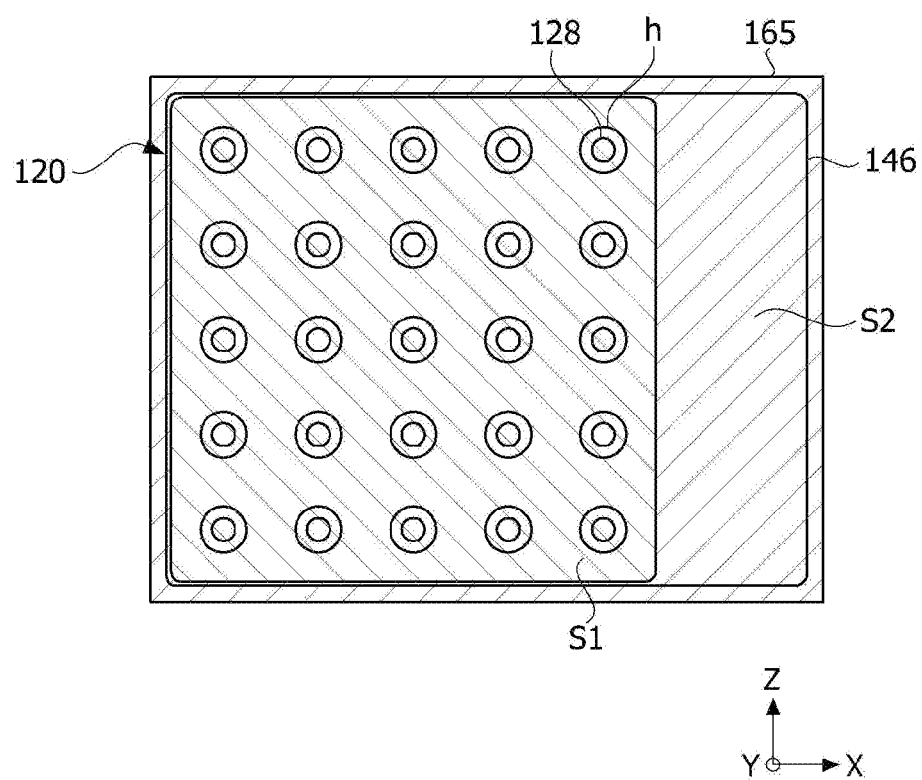

[FIG. 5]
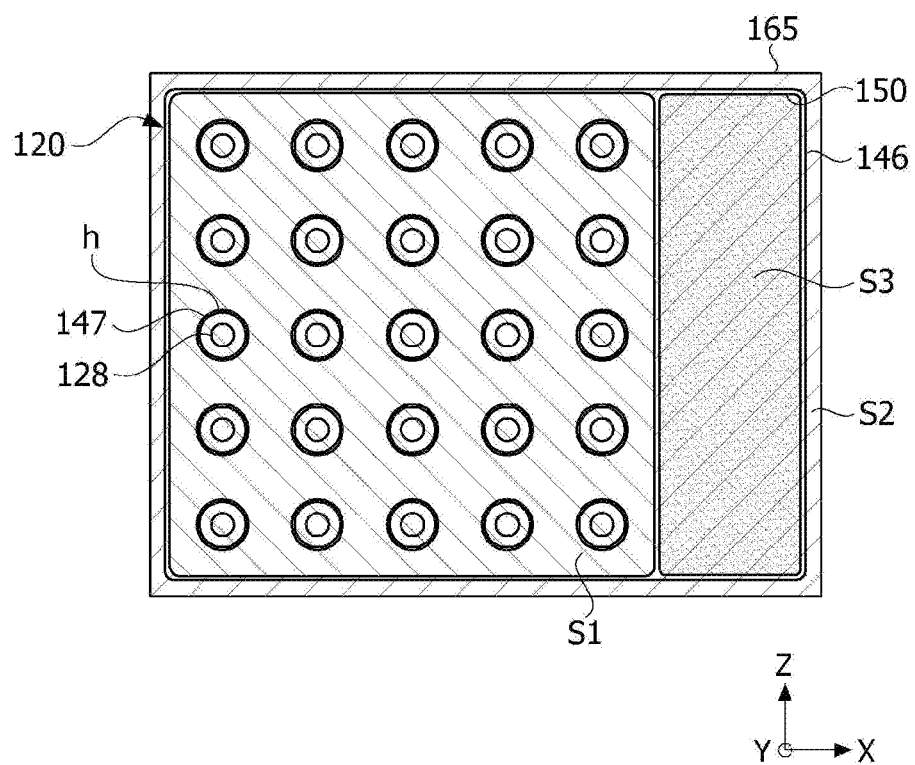

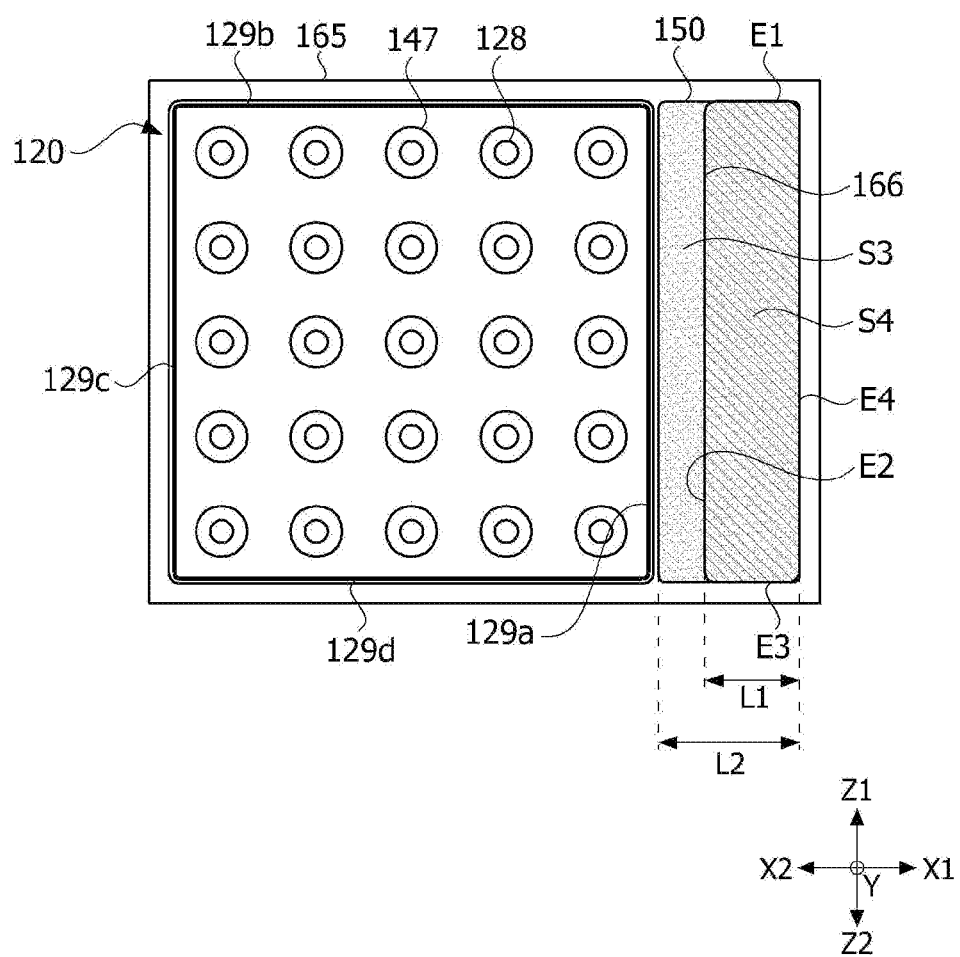
[FIG. 6]

[FIG. 7]
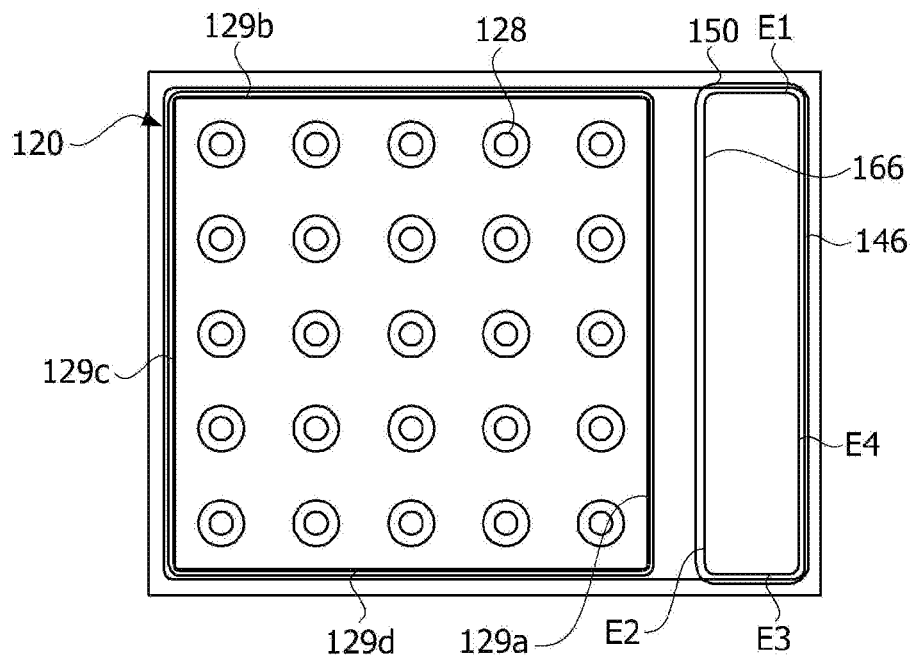
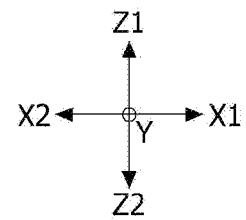
[FIG. 8A]
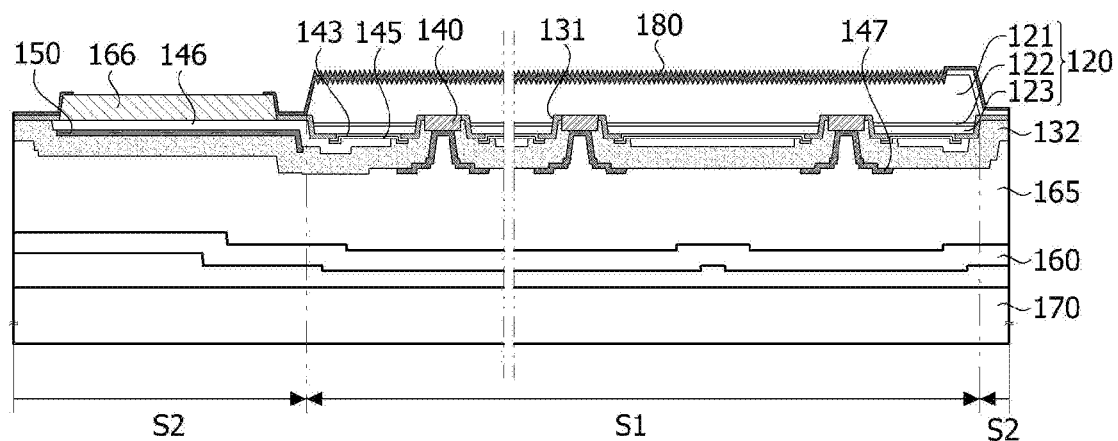

【FIG. 8B】
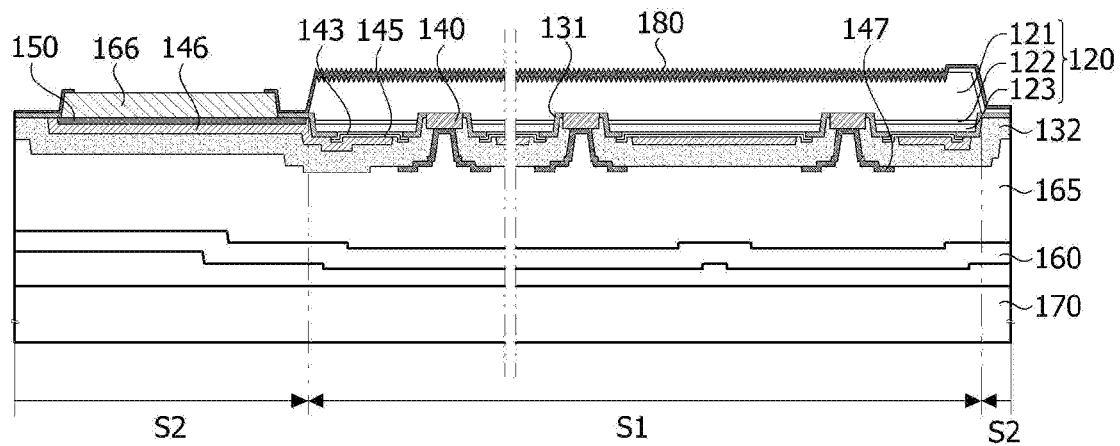
【FIG. 9】
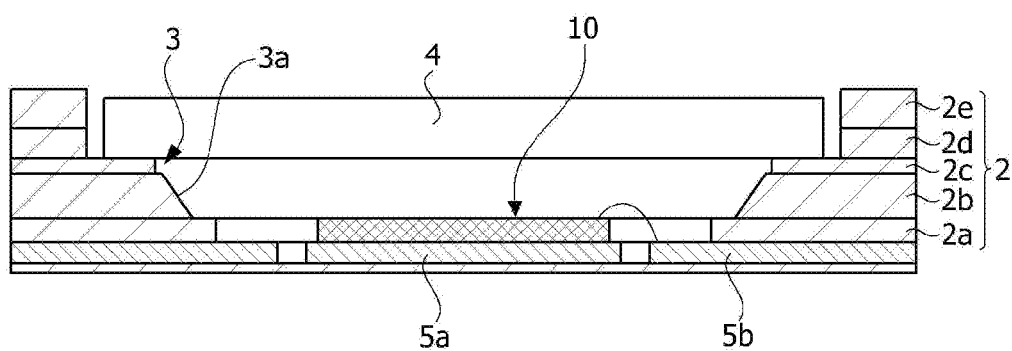

[FIG. 10]
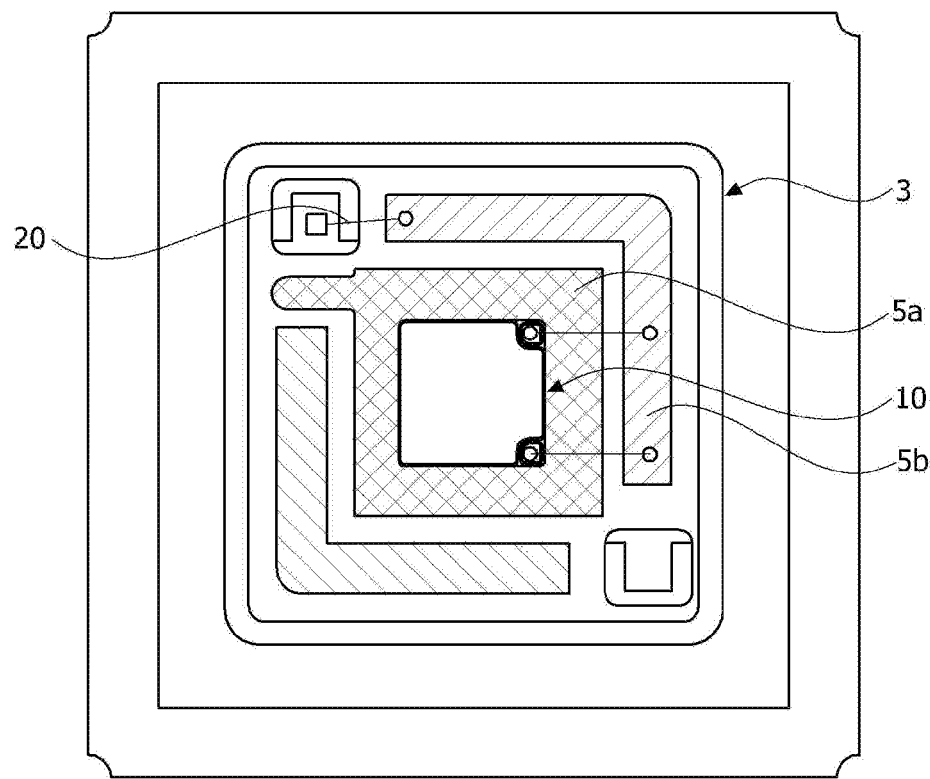
[FIG. 11A]
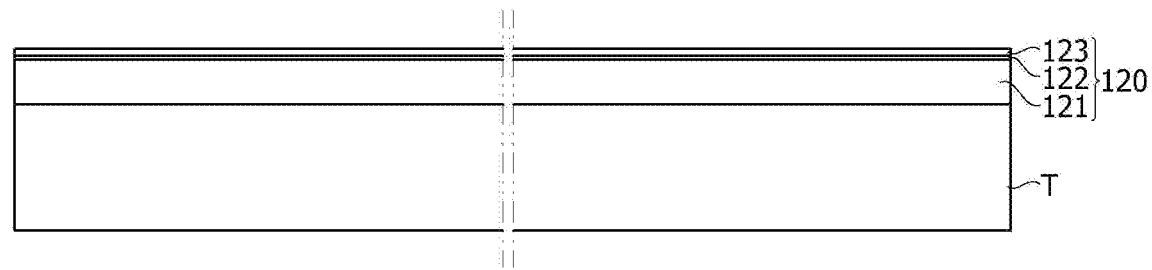

[FIG. 11B]
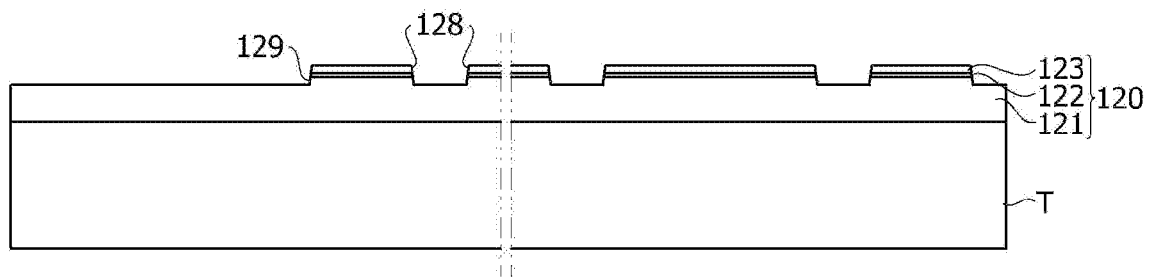
[FIG. 11C]
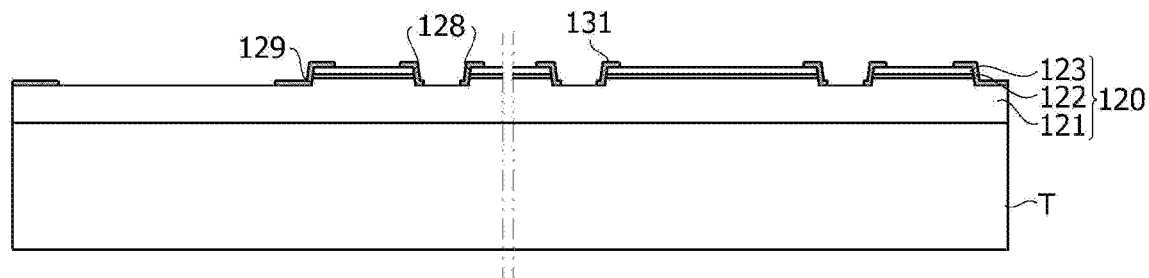
[FIG. 11D]
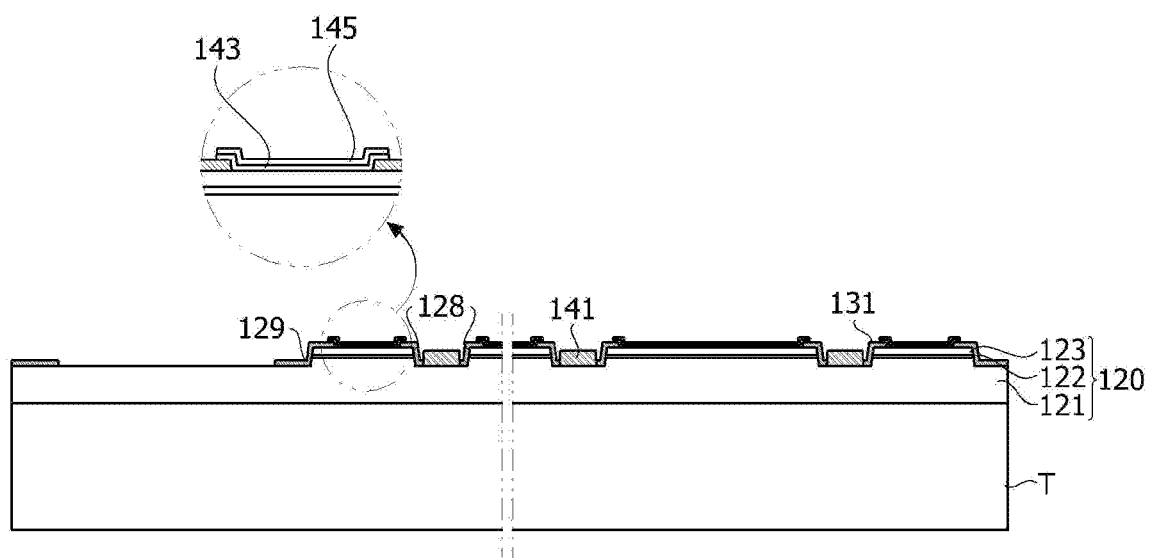

[FIG. 11E]
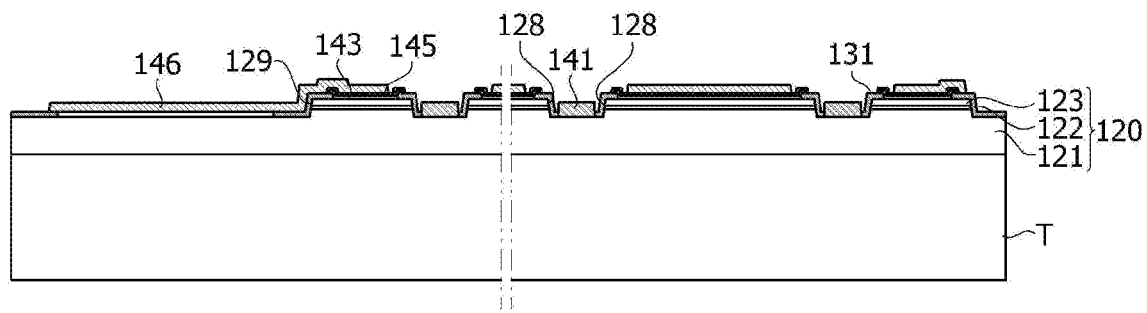
[FIG. 11F]
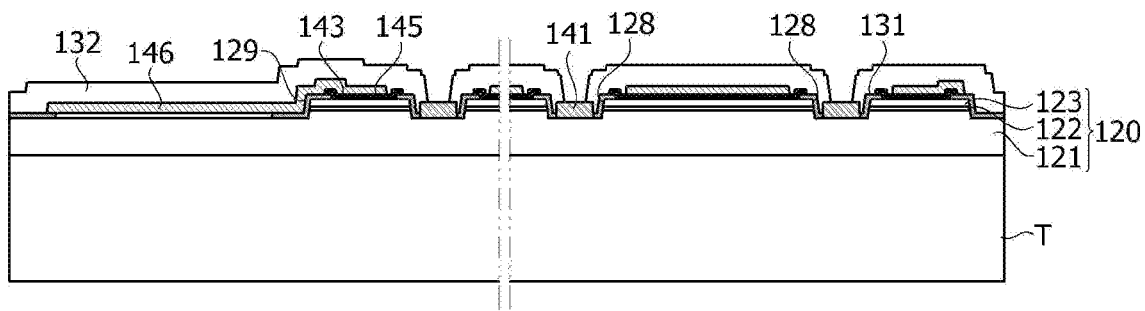
[FIG. 11G]
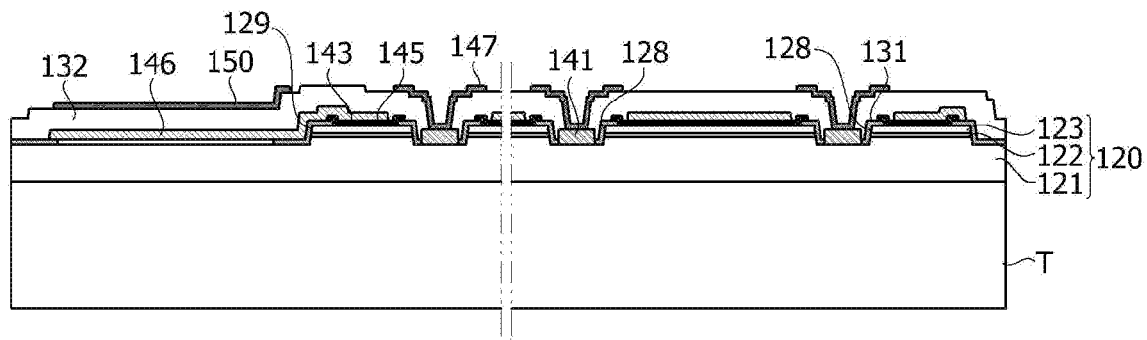

[FIG. 11H]
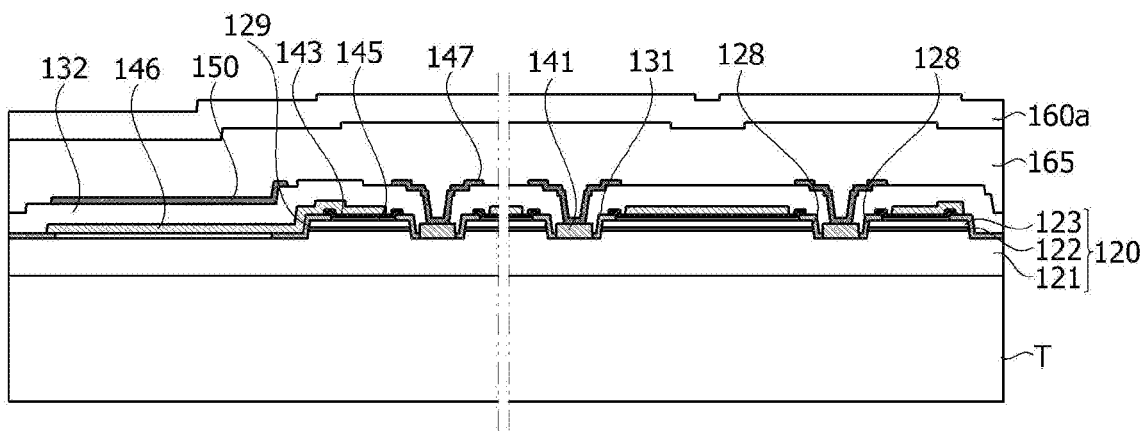
[FIG. 11I]
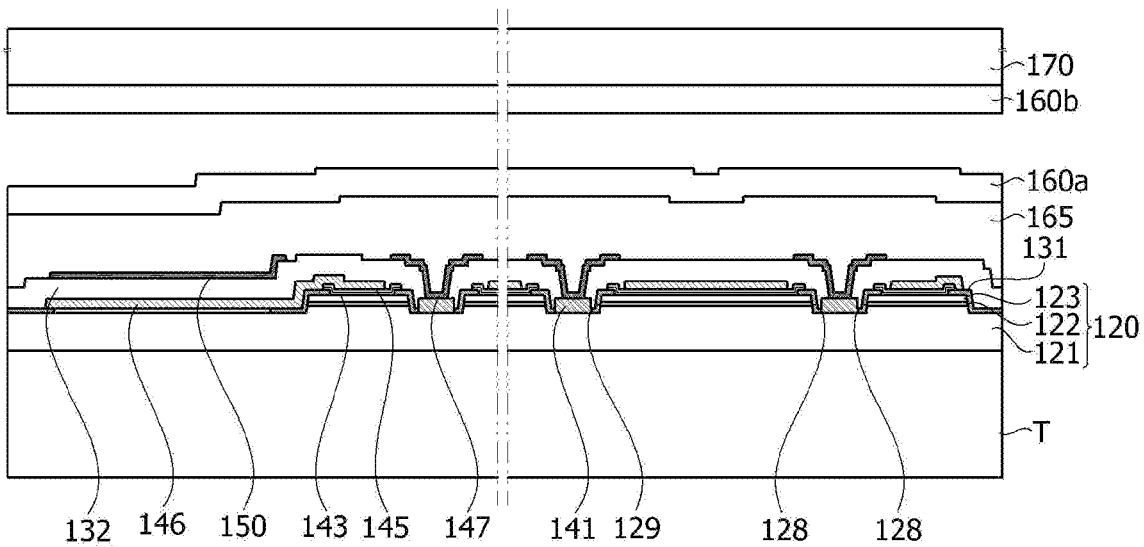

[FIG. 11J]
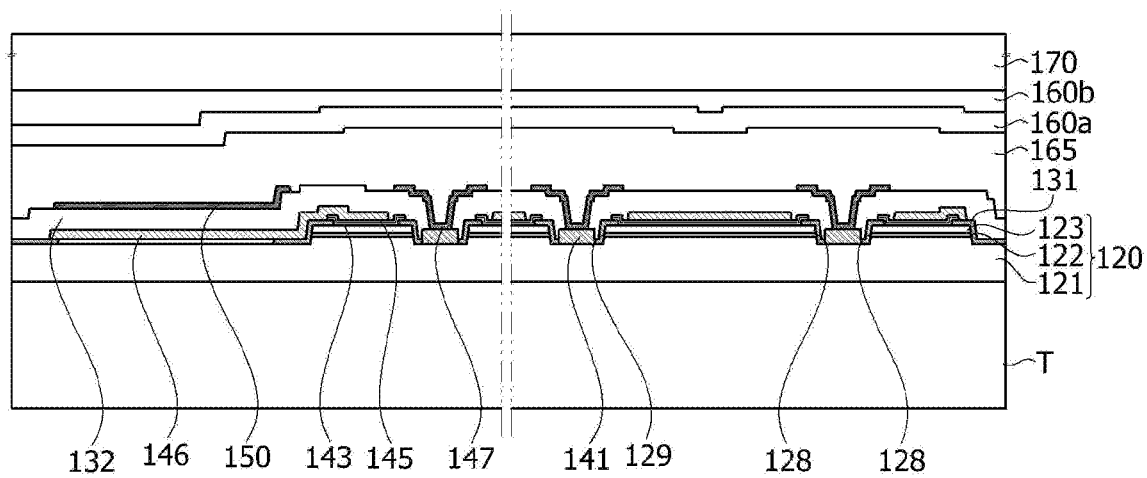
[FIG. 11K]
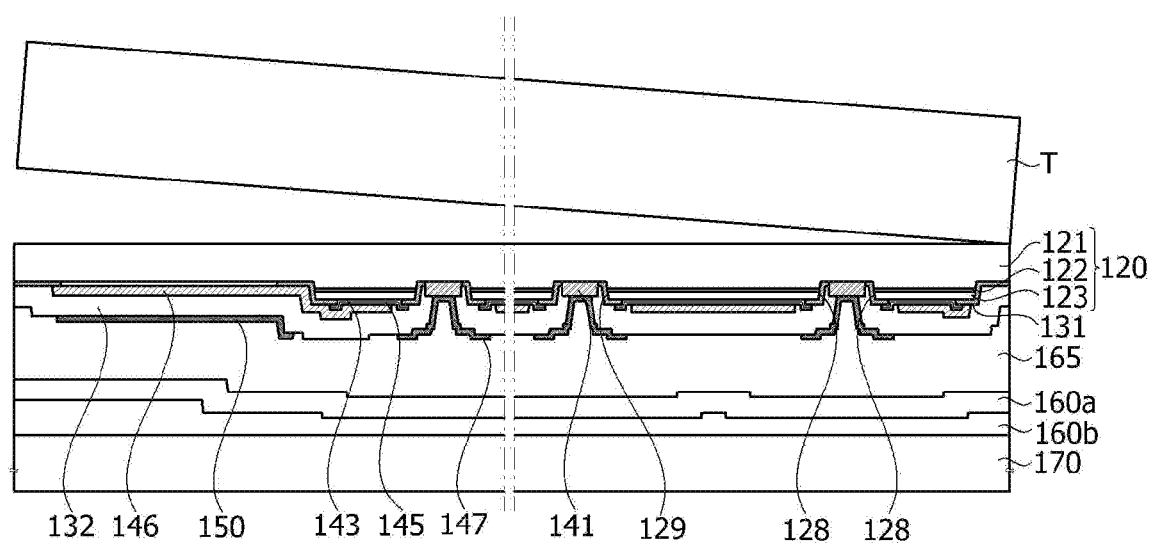

【FIG. 11L】
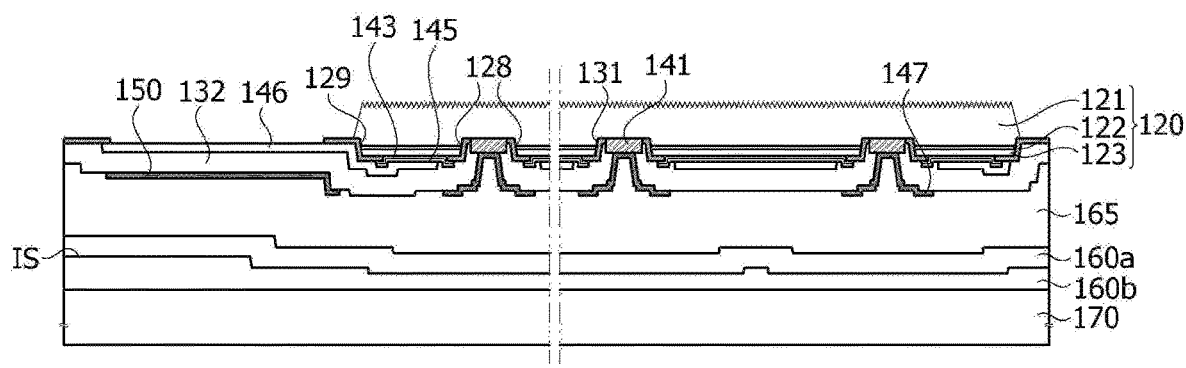
【FIG. 11M】
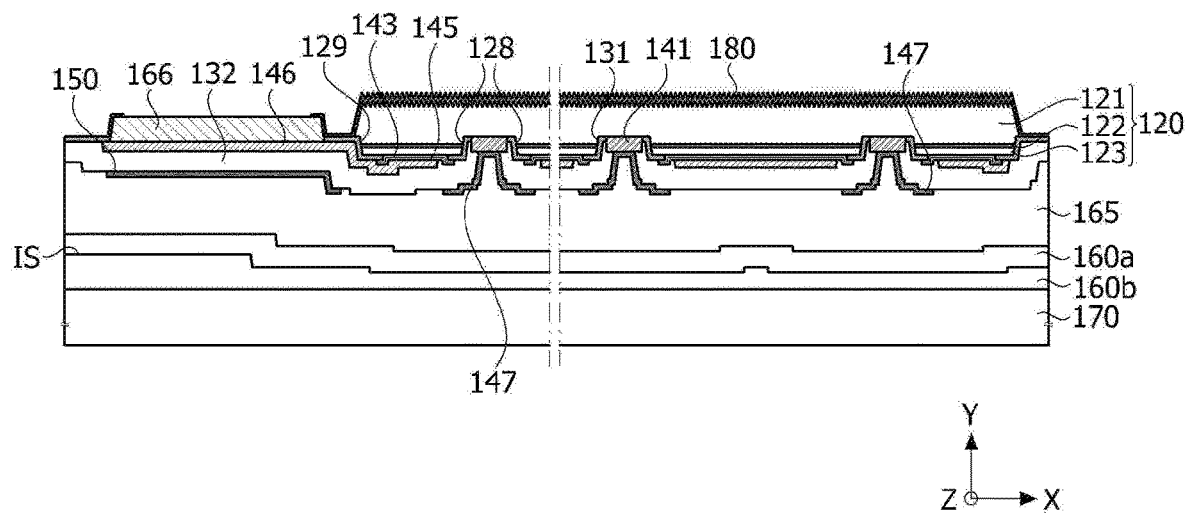

SEMICONDUCTOR DEVICE

CROSS-REFERENCE TO RELATED PATENT APPLICATIONS

This application is a U.S. National Stage Application under 35 U.S.C. § 371 of PCT Application No. PCT/KR2019/003347, filed Mar. 22, 2019, which claims priority to Korean Patent Application No. 10-2018-0039193, filed Apr. 4, 2018, whose entire disclosures are hereby incorporated by reference.

TECHNICAL FIELD

The present invention relates to a semiconductor device.

BACKGROUND ART

Semiconductor devices including compounds such as GaN and AlGaN may be variously used as light-emitting devices, light-receiving devices, and various diodes due to many advantages thereof, such as wide and easily adjustable bandgap energy.

In particular, light-emitting devices, such as light-emitting diodes and laser diodes, which use a III-V group or II-VI group compound semiconductor material, are capable of rendering various colors, such as red, green, and blue, and ultraviolet rays by virtue of the development of thin-film growth technologies and device materials, are capable of producing white light at high efficiency using fluorescent materials or through color mixing, and have advantages such as low power consumption, semi-permanent lifespan, fast response speed, safety, and environmental friendliness as compared with conventional light sources such as fluorescent lamps and incandescent lamps.

In addition, when a light-receiving device such as a photodetector or a solar cell is manufactured using a III-V group or II-VI group compound semiconductor material, due to the development of an element material, the light-receiving device generates a photocurrent by absorbing light in various wavelength regions so that light in various wavelength regions from a gamma ray region to a radio wavelength region can be used. In addition, since the light-receiving device has advantages of having fast response speed, safety, environmental friendliness, and easy control of an element material, the light-receiving device can also be easily used for power control, microwave circuits, or communication modules.

Accordingly, application of the semiconductor device has expanded to being applied as a transmission module of an optical communication device, a light-emitting diode (LED) backlight capable of replacing a cold cathode fluorescent lamp (CCFL) which constitutes a backlight of a liquid crystal display (LCD) device; a white LED lighting device capable of replacing a fluorescent lamp or an incandescent lamp; a headlight for a vehicle; a traffic light; a sensor for sensing gas or fire; and the like. In addition, the application of the semiconductor device may be expanded to a high frequency application circuit, another power control device, and a communication module.

In particular, when a semiconductor device is implemented as a vertical type, reliability thereof is lowered, and thus, a pad is peeled off.

SUMMARY

The present invention is directed to providing a red semiconductor device as a vertical type.

The present invention is also directed to providing a semiconductor device having high reliability.

The present invention is also directed to providing a semiconductor device having excellent current spreading.

The object of the embodiments is not limited to the aforesaid objects and includes objects or effects that may be recognized from technical solutions or embodiments described hereinafter.

According to an embodiment of the present invention, a semiconductor device includes a substrate, a semiconductor structure which is disposed on the substrate and includes a first conductivity-type semiconductor layer, a second conductivity-type semiconductor layer, and an active layer disposed between the first conductivity-type semiconductor layer and the second conductivity-type semiconductor layer, a bonding layer disposed between the semiconductor structure and the substrate, a cover layer disposed between the bonding layer and the semiconductor structure, and an electrode pad disposed on the cover layer and spaced apart from the semiconductor structure, wherein the semiconductor structure further includes a stepped portion at which a side surface of the second conductivity-type semiconductor layer, a side surface of the active layer, and a lower surface of the first conductivity-type semiconductor layer are exposed, the stepped portion is disposed at an outer portion of the semiconductor structure, and the cover layer is disposed to extend from a region vertically overlapping the electrode pad to a region vertically overlapping a partial region of the exposed lower surface of the first conductivity-type semiconductor layer.

The semiconductor device may further include a first conductive layer electrically connected to the first conductivity-type semiconductor layer, and a second conductive layer electrically connected to the second conductivity-type semiconductor layer, wherein the bonding layer is disposed between the first conductive layer and the substrate, and the second conductive layer is disposed between the first conductive layer and the semiconductor structure and between the electrode pad and the first conductive layer.

The electrode pad may be disposed to be spaced apart from the semiconductor structure, and the semiconductor device may further include a first insulating layer disposed between the semiconductor structure and the second conductive layer, and a second insulating layer disposed between the second conductive layer and the first conductive layer.

The cover layer may be disposed between the first conductive layer and the second insulating layer or between the second insulating layer and the second conductive layer.

The electrode pad may overlap the cover layer in a vertical direction.

The semiconductor structure may further include a stepped portion, at which a partial region of the first conductivity-type semiconductor layer and the side surfaces of the second conductivity-type semiconductor layer and the active layer are exposed, at an edge of the semiconductor structure.

A length ratio of a minimum length of the stepped portion to a length of the cover layer in a vertical direction may be in a range of 1:0.2 to 1:1.5.

The cover layer may extend toward the semiconductor structure.

The cover layer may include an inclined surface corresponding to the stepped portion.

A minimum length of the inclined surface in a vertical direction may be the same as a minimum length of the stepped portion in the vertical direction.

Advantageous Effects

According to embodiments, a semiconductor device may be implemented as a vertical type.

In addition, it is possible to manufacture a semiconductor device having high reliability.

Furthermore, it is possible to manufacture a semiconductor device having excellent current spreading.

The various and advantageous advantages and effects of the present invention are not limited to the above description and may be more easily understood in the course of describing specific embodiments of the present invention.

BRIEF DESCRIPTION OF THE DRAWINGS

FIG. 1 is a plan view of a semiconductor device according to an embodiment of the present invention.

FIG. 2 is a cross-sectional view taken along line A-A' in FIG. 1.

FIG. 3 is an enlarged view of portion B in FIG. 2.

FIG. 4 is a plan view illustrating a semiconductor structure, a first conductive layer, and a second conductive layer according to the embodiment.

FIG. 5 is a plan view illustrating the semiconductor structure, a cover layer, a second reflective layer, and the second conductive layer according to the embodiment.

FIG. 6 is a plan view illustrating the semiconductor structure, an electrode pad, the cover layer, and the second reflective layer according to the embodiment.

FIG. 7 is a modified example of FIG. 6.

FIG. 8A is a cross-sectional view of a semiconductor device according to another embodiment.

FIG. 8B is a cross-sectional view of a semiconductor device according to still another embodiment.

FIG. 9 is a conceptual view of a semiconductor device package according to an embodiment of the present invention.

FIG. 10 is a plan view of the semiconductor device package according to the embodiment of the present invention.

FIGS. 11A to 11M are sequence diagrams for describing a method of manufacturing a semiconductor device according to an embodiment.

DETAILED DESCRIPTION

While the present invention is open to various modifications and alternative embodiments, specific embodiments thereof will be described and shown by way of example in the accompanying drawings. However, it should be understood that there is no intention to limit the present invention to the particular embodiments disclosed, and, on the contrary, the present invention is to cover all modifications, equivalents, and alternatives falling within the spirit and scope of the present invention.

It should be understood that, although the terms including ordinal numbers such as first, second, and the like may be used herein to describe various elements, the elements are not limited by the terms. The terms are used only for the purpose of distinguishing one element from another. For example, without departing from the scope of the present invention, a second element could be termed a first element, and similarly a first element could be also termed a second element. The term "and/or" includes any one or all combinations of a plurality of associated listed items.

In the case that one component is mentioned as being "connected" or "linked" to another component, it may be connected or linked to the corresponding component directly or other components may be present therebetween. On the other hand, in the case that one component is mentioned as being "directly connected" or "directly linked" to another component, it should be understood that other components are not present therebetween.

It is to be understood that terms used herein are for the purpose of the description of particular embodiments and not for limitation. A singular expression includes a plural expression unless the context clearly indicates otherwise. It will be further understood that the terms "comprises" and/or "comprising," when used in this specification, specify the presence of stated features, integers, steps, operations, elements, components, and/or groups thereof but do not preclude the presence or addition of one or more other features, integers, steps, operations, elements, components, and/or groups thereof.

Unless defined otherwise, all the terms (including technical and scientific terms) used herein have the same meaning as commonly understood by one of ordinary skill in the art to which the present invention belongs. It will be further understood that the terms, such as those defined in commonly used dictionaries, should be interpreted as having meanings that are consistent with their meanings in the context of the relevant art and should not be interpreted in an idealized or overly formal sense unless expressly defined otherwise herein.

Hereinafter, embodiments will be described in detail with reference to the accompanying drawings, the same or corresponding elements will be given the same reference numbers regardless of drawing symbols, and redundant descriptions will be omitted.

FIG. 1 is a plan view of a semiconductor device according to an embodiment of the present invention, FIG. 2 is a cross-sectional view taken along line A-A' in FIG. 1, and FIG. 3 is an enlarged view of portion B in FIG. 2.

Referring to FIGS. 1 to 3, a semiconductor device 10 according to the embodiment may include a semiconductor structure 120 including a first conductivity-type semiconductor layer 121, a second conductivity-type semiconductor layer 123, and an active layer 122, a first electrode 141 electrically connected to the first conductivity-type semiconductor layer 121, a second electrode 143 electrically connected to the second conductivity-type semiconductor layer 123, a first conductive layer 165 electrically connected to the first electrode 141, a second conductive layer 146 electrically connected to the second electrode 143, a bonding layer 160 disposed below the first conductive layer 165, and a substrate 170 disposed below the bonding layer 160.

First, the semiconductor structure 120 may include the first conductivity-type semiconductor layer 121, the active layer 122, and the second conductivity-type semiconductor layer 123.

In addition, in order to improve moisture resistance and prevent reliability degradation of the semiconductor device 10 due to permeation of contaminants, the semiconductor structure 120 may include a stepped portion 129 which is formed at an outer portion of the semiconductor structure 120 to pass through the second conductivity-type semiconductor layer 123 and the active layer 122 and to expose a partial region of the first conductivity-type semiconductor layer 121. Thus, a lower surface of the second conductivity-type semiconductor layer 123 and a lower surface f1 of the first conductivity-type semiconductor layer 121 are spaced apart from each other in a vertical direction at the outer portion of the semiconductor structure 120. An outer surface f2 of the active layer 122 and an outer surface f3 of the second conductivity-type semiconductor layer 123 may be exposed at the stepped portion 129.

In addition, in order to improve current injection characteristics of the semiconductor device 10 to improve an amount of light emitted by the semiconductor device 10, improve operating voltage characteristics, or improve light extraction efficiency, the semiconductor structure 120 may include a recess 128 formed inside the stepped portion 129 to pass through the second conductivity-type semiconductor layer 123 and the active layer 122 and to expose a partial region of the first conductivity-type semiconductor layer 121.

The first conductivity-type semiconductor layer 121, the active layer 122, and the second conductivity-type semiconductor layer 123 may be disposed in a second direction (Y-direction). Hereinafter, a vertical direction of each layer, i.e., the second direction (Y-direction) is defined as a vertical direction, a first direction (X-direction) perpendicular to the second direction (Y-direction) is defined as a horizontal direction, and a third direction (Z-direction) is defined as a direction perpendicular to the first direction (X-direction) and the second direction (Y-direction).

First, the semiconductor structure 120 may be implanted using a III-V group compound semiconductor, a II-VI group compound semiconductor, or the like and may be doped with a first dopant. The first conductivity-type semiconductor layer 121 may be made of a semiconductor material having an empirical formula of $In_{x1}Al_{y1}Ga_{1-x1-y1}N$ ($0 \leq x1 \leq 1$, $0 \leq y1 \leq 1$, and $0 \leq x1+y1 \leq 1$), for example, a material selected from among GaN, AlGaN, InGaN, and InAlGaN. The first dopant may be an n-type dopant such as silicon (Si), germanium (Ge), tin (Sn), selenium (Se), or tellurium (Te). When the first dopant is an n-type dopant, the first conductivity-type semiconductor layer 121 doped with the first dopant may be an n-type semiconductor layer.

The active layer 122 may be disposed between the first conductivity-type semiconductor layer 121 and the second conductivity-type semiconductor layer 123. The active layer 122 is a layer in which electrons (or holes) injected through the first conductivity-type semiconductor layer 121 meet holes (or electrons) injected through the second conductivity-type semiconductor layer 123. As electrons and holes are recombined to transition to a low energy level, the active layer 122 may generate light having an ultraviolet wavelength.

The active layer 122 may have any one of a single well structure, a multi well structure, a single quantum well structure, a multi quantum well (MQW) structure, a quantum dot structure, and a quantum line structure, but the present invention is not limited thereto.

The second conductivity-type semiconductor layer 123 may be disposed on the active layer 122, may be implemented using a III-V group compound semiconductor, a II-VI group compound semiconductor, or the like, and may be doped with a second dopant. The second conductivity-type semiconductor layer 123 may be made of a semiconductor material having an empirical formula of $In_{x5}Al_{y2}Ga_{1-x5-y2}N$ ($0 \leq x5 \leq 1$, $0 \leq y2 \leq 1$, and $0 \leq x5+y2 \leq 1$) or may be made of a material selected from among AlInN, AlGaAs, GaP, GaAs, GaAsP, and AlGaInP. When the second dopant is a p-type dopant such as magnesium (Mg), zinc (Zn), calcium (Ca), strontium (Sr), or barium (Ba), the second conductivity-type semiconductor layer 123 doped with the second dopant may be a p-type semiconductor layer.

Additionally, an electron blocking layer (not shown) may be disposed between the active layer 122 and the second conductivity-type semiconductor layer 123. The electron blocking layer (not shown) blocks electrons supplied from the first conductivity-type semiconductor layer 121 from flowing to the second conductivity-type semiconductor layer 123, thereby increasing the probability that electrons and holes are recombined in the active layer 122. An energy band gap of the electron blocking layer (not shown) may be greater than an energy band gap of the active layer 122 and/or the second conductivity-type semiconductor layer 123.

The electron blocking layer (not shown) may include at least one selected from among semiconductor materials having an empirical formula of $In_{x1}Al_{y1}Ga_{1-x1-y1}N$ ($0 \leq x1 \leq 1$, $0 \leq y1 \leq 1$, and $0 \leq x1+y1 \leq 1$), for example, AlGaN, InGaN, and InAlGaN, but the present invention is not limited thereto. In the electron blocking layer (not shown), a first layer (not shown) having a high aluminum composition and a second layer (not shown) having a low aluminum composition may be alternately disposed.

The recess 128 may disposed to pass through the second conductivity-type semiconductor layer 123 and the active layer 122 and extend to a partial region of the first conductivity-type semiconductor layer 121.

A plurality of recesses 128 may be formed in the semiconductor structure 120 and may be spaced apart from each other by a predetermined distance. For example, when the semiconductor structure 120 has high bandgap energy, a current spreading property of the semiconductor structure 120 may be degraded. However, since the semiconductor structure 120 includes the recess 128 to electrically connect the first conductivity-type semiconductor layer 121 and the first electrode 141 exposed in the recesses 128, it is possible to improve a current spreading property in the semiconductor structure 120 and improve a property of a current injection into the semiconductor structure 120. Due to such a configuration, the recess 128 in the semiconductor device 10 according to the embodiment may improve a current spreading property of the semiconductor structure 120 and increase an emission region thereof.

In addition, when a process margin for removing only the second conductivity-type semiconductor layer 123 and the active layer 122 is possible, the stepped portion 129 may be formed of the outer surface f3 of the second conductivity-type semiconductor layer 123, the outer surface f2 of the active layer 122, and the lower surface f1 of the first conductivity-type semiconductor layer 121. That is, the lower surface of the first conductivity-type semiconductor layer 121 may be the same surface that is in contact with an upper surface of the active layer 122. However, when a process margin for arranging the stepped portion 129 is taken into account, the stepped portion 129 may further include not only the exposed lower surface of the first conductivity-type semiconductor layer 121 but also an inclined surface of the first conductivity-type semiconductor layer 121, which is a portion of a first inclined surface I1 to be described below.

In addition, the stepped portion 129 may be continuously disposed along an outer surface of the semiconductor structure 120 like the recess 128. Accordingly, the stepped portion 129 may have at least one inclined surface that is disposed to be spaced apart from the outer surface of the semiconductor structure 120 in the horizontal direction (X-direction) and is continuously disposed along the outer surface. In addition, the stepped portion 129 should be provided such that the outer surface of the active layer 122 is exposed, and the outer surface of the semiconductor structure 120 may be an outer surface of the first conductivity-type semiconductor layer 121. Here, a gradient of the outer surface of the semiconductor structure 120 or the outer surface of the first conductivity-type semiconductor layer 121 with respect to a lower surface of the second conductivity-type semiconductor layer 123 may be different from a gradient between the outer surface f2 of the active layer 122 and the lower surface of the second conductivity-type semiconductor layer 123 at the stepped portion 129. Accordingly, a first insulating layer 131 may be disposed as close as possible to the stepped portion 129 to greatly increase adhesion between the first insulating layer 131 to be described below and the semiconductor structure 120.

The stepped portion 129 may be disposed to surround the plurality of recesses 128 in the semiconductor structure 120. That is, the stepped portion 129 may be formed in a closed-loop in a plan view (X-Z plane) in the semiconductor structure 120. However, the present invention is not limited thereto. For example, in the stepped portion 129, the lower surface f1 of the first conductivity-type semiconductor layer 121 may be disposed to surround and seal the active layer 122. However, the present invention is not limited thereto, and a partial region of the active layer 122 may be exposed outside the outer surface f3 of the second conductivity-type semiconductor layer 123 in the stepped portion 129. Due to such a configuration, since the semiconductor structure 120 includes a region in which a separation distance between the outer surface of the first conductivity-type semiconductor layer 121 (the above-described outer portion of the semiconductor structure 120) and the active layer 122 is increased, even when peeling-off or the like occurs between a passivation layer 180 and the semiconductor structure 120, it may be difficult for external contaminants, moisture, and the like to reach the active layer 122. Here, the peeling-off between the semiconductor structure 120 and the passivation layer 180 may occur due to a difference in thermal expansion coefficient between the substrate 170 and the semiconductor device 10, which is caused by heat generated during an operation of the semiconductor device 10. The stepped portion 129 can prevent the active layer 122 from being oxidized or damaged by contaminants or moisture, thereby preventing light efficiency and electrical characteristics from being degraded.

The first insulating layer 131 may be disposed between the semiconductor structure 120 and the substrate 170 and may be disposed inside the recess 128 and in the stepped portion 129. Specifically, the first insulating layer 131 may electrically insulate the first conductivity-type semiconductor layer 121, the second conductivity-type semiconductor layer 123, and the active layer 122, which are included in the stepped portion 129, from the substrate 170 and may electrically insulate the first electrode 141 from the active layer 122 and the second conductivity-type semiconductor layer 123. Here, the first insulating layer 131 may be made of a dielectric or an insulator. For example, the first insulating layer 131 may be made of an oxide and/or a nitride and may optionally include, for example, at least one selected from the group consisting of SiO2, SixOy, Si3N4, SixNy, SiOxNy, Al2O3, TiO2, and AlN, but the present invention is not limited thereto.

In addition, the first insulating layer 131 may be formed as a single-layer or a multi-layer. The first insulating layer 131 may be formed as the multi-layer, and thus, an interface between adjacent layers may be formed.

When the first insulating layer 131 is formed as the single-layer, a path, through which external moisture or contaminants may permeate, may be exposed due to internal defects. On the other hand, when the first insulating layer 131 is formed as the multi-layer, internal defects may be prevented from being exposed to the outside, thereby reducing external moisture and contaminants permeating into the semiconductor structure 120 through the first insulating layer 131. However, the present invention is not limited thereto, and when the internal defects of the first insulating layer 131 exposed to the outside are small, the first insulating layer 131 may be formed as the single-layer.

In addition, the first insulating layer 131 may be a distributed Bragg reflector (DBR) having a multi-layer structure that includes Si oxide or a titanium (Ti) compound. However, the present invention is not limited to the structure, and the first insulating layer 131 may have various reflective structures. Thus, the first insulating layer 131 can improve light extraction efficiency.

The first electrode 141 may be disposed below the semiconductor structure 120 and in the recess 128. Accordingly, the first electrode 141 may be electrically connected to the first conductivity-type semiconductor layer 121 exposed by the recess 128. The first electrode 141 may be in ohmic contact with the first conductivity-type semiconductor layer 121 and thus may be an ohmic electrode. For example, the first electrode 141 may be made of at least one selected from among indium tin oxide (ITO), indium zinc oxide (IZO), indium zinc tin oxide (IZTO), indium aluminum zinc oxide (IAZO), indium gallium zinc oxide (IGZO), indium gallium tin oxide (IGTO), aluminum zinc oxide (AZO), antimony tin oxide (ATO), gallium zinc oxide (GZO), IZO nitride (IZON), Al—Ga ZnO (AGZO), In—Ga ZnO (IGZO), ZnO, IrOx, RuOx, NiO, RuOx/ITO, Ni/IrOx/Au, Ni/IrOx/Au/ITO, silver (Ag), nickel (Ni), chromium (Cr), titanium (Ti), aluminum (Al), rhodium (Rh), palladium (Pd), iridium (Ir), tin (Sn), indium (In), ruthenium (Ru), magnesium (Mg), zinc (Zn), platinum (Pt), gold (Au), and hafnium (Hf), but the present invention is not limited to such materials. In addition, the first electrode 141 may include a plurality of layers made of a metal.

The second electrode 143 may be disposed below the semiconductor structure 120 and below the second conductivity-type semiconductor layer 123. Accordingly, the second electrode 143 may be electrically connected to the second conductivity-type semiconductor layer 123.

For example, the second electrode 143 may be in contact with the second conductivity-type semiconductor layer 123 and may extend below the first insulating layer 131 to cover a portion of the first insulating layer 131. Due to such a configuration, an area, in which the second electrode 143 is in contact with the second conductivity-type semiconductor layer 123, may be maximized to increase a current injection area, thereby improving light extraction efficiency and preventing peeling-off from occurring between the first insulating layer 131 and the semiconductor structure 120.

In addition, the second electrode 143 may be an ohmic electrode in ohmic contact with the second conductivity-type semiconductor layer 123. For example, the second electrode 143 may be made of at least one selected from among ITO, IZO, IZTO, IAZO, IGZO, IGTO, AZO, ATO, GZO, IZON, AGZO, IGZO, ZnO, IrOx, RuOx, NiO, RuOx/ITO, Ni/IrOx/Au, Ni/IrOx/Au/ITO, Ag, Ni, Cr, Ti, Al, Rh, Pd, Ir, Sn, In, Ru, Mg, Zn, Pt, Au, and Hf, but the present invention is not limited to such materials. For example, the second electrode 143 may be made of ITO.

A second reflective layer 145 may be disposed below the second electrode 143 to be electrically connected to the second electrode 143. The second reflective layer 145 may reflect light, which is emitted from the active layer 122 toward the second reflective layer 145, to an upper portion of the semiconductor structure 120. In addition, the second electrode 143 may be partially covered by the second conductive layer 146 and may be electrically connected to the second conductive layer 146.

The second reflective layer 145 may include a conductive and reflective material and may include, for example, any one of Ag and Rh, but the present invention is not limited to such materials. The second reflective layer 145 may include aluminum, but in this case, since a step coverage is relatively low, only a portion of the second electrode 143 may be covered. However, the present invention is not limited to such a material.

The second conductive layer 146 may be disposed below the second reflective layer 145 to cover a portion of the second reflective layer 145 and a portion of the second electrode 143. Accordingly, an electrode pad 166, the second conductive layer 146, the second reflective layer 145, and the second electrode 143 may have one electrical channel.

The second conductive layer 146 may be disposed to surround the second reflective layer 145 and may be disposed below the second reflective layer 145, the second electrode 143, and the first insulating layer 131. The second conductive layer 146 may include a material having high adhesion with the first insulating layer 131 and may be made, for example, of at least one material selected from the group consisting of materials such as Cr, Ti, Ni, and Au, or an alloy thereof. The second conductive layer 146 may include a single-layer or a plurality of layers.

The second conductive layer 146 may be disposed between the first insulating layer 131 and a second insulating layer 132 and may be protected from permeation of external moisture or contaminants by the first insulating layer 131 and the second insulating layer 132. In addition, the second conductive layer 146 may be disposed inside the semiconductor device 10 and may be surrounded by the second insulating layer 132 so as not to be exposed at an outermost surface of the semiconductor device 10.

The second insulating layer 132 may electrically insulate the second electrode 143, the second reflective layer 145, and the second conductive layer 146 from the first conductive layer 165. The first conductive layer 165 may pass through the second insulating layer 132 to be electrically connected to the first electrode 141.

The second insulating layer 132 and the first insulating layer 131 may be made of the same material and may be made of at least one selected from the group consisting of SiO2, SixOy, Si3N4, SixNy, SiOxNy, Al2O3, TiO2, and AlN, but the present invention is not limited thereto. However, the present invention is not limited to such materials, and the second insulating layer 132 may be made of a different material from the first insulating layer 131.

In addition, according to an embodiment, since the second insulating layer 132 is disposed on the first insulating layer 131 between the first electrode 141 and the second electrode 143, when defects are generated in the second insulating layer 132, the first insulating layer 131 may secondarily prevent permeation of external moisture and/or other contaminants. In an example, when the first insulating layer 131 and the second insulating layer 132 are formed as one layer, cracks, internal defects, and the like may be easily propagated in a vertical direction. Therefore, external moisture or contaminants may permeate into the semiconductor structure 120 through defects exposed to the outside.

However, according to an embodiment, since the additional second insulating layer 132 is disposed on the first insulating layer 131, it is difficult for defects generated in the first insulating layer 131 to be propagated to the second insulating layer 132. That is, an interface between the first insulating layer 131 and the second insulating layer 132 may serve to block propagation of defects.

A first reflective layer 147 may be disposed below the second insulating layer 132 and may pass through the second insulating layer 132 to be disposed below the first electrode 141 and electrically connected to the first electrode 141. Since the first reflective layer 147 includes a conductive and reflective material, the first reflective layer 147 may reflect light generated in the active layer 122 to the upper portion of the semiconductor structure 120.

The first reflective layer 147 may include, for example, any one of Ag and Rh, but the present invention is not limited to such materials. The first reflective layer 147 may partially cover a lower portion of the first electrode 141 and may extend outside the recess 128.

The first conductive layer 165 may be disposed below the second insulating layer 132 and the first reflective layer 147. As described above, the first conductive layer 165 may pass through the second insulating layer 132 to be electrically connected to the first electrode 141 and may also be electrically connected to the substrate 170 thereunder. Accordingly, the first conductive layer 165 may have an electrical channel with the first electrode 141 and the substrate 170. The first conductive layer 165 may be made of at least one material selected from the group consisting of materials such as Cr, Ti, Ni, and Au, or an alloy thereof and may include a single-layer or a plurality of layers.

The first conductive layer 165 may be entirely disposed within the semiconductor device 10. The first conductive layer 165 may be divided into a first region S1 and a second region S2. The first region S1 is a region in which the semiconductor structure 120 and the first conductive layer 165 overlap each other in the vertical direction (Y-direction), and the second region S2 is a region excluding the first region R1, i.e., a region outside the semiconductor structure 120 and is a region which does not overlap the semiconductor structure 120 in the vertical direction (Y-direction). This will be described in detail with reference to FIG. 4.

A cover layer 150 may be disposed between the first conductive layer 165 and the semiconductor structure 120. In the semiconductor device 10 according to the embodiment, the cover layer 150 may be disposed in at least one of a position between the second insulating layer 132 and the second conductive layer 146 and a position between the second conductive layer 146 and the first insulating layer 131 on the first conductive layer 165.

As shown in FIGS. 2 to 3, descriptions will be given based on the cover layer 150 being disposed between the first conductive layer 165 and the second insulating layer 132. The cover layer 150 may be disposed between the first conductive layer 165 and the second insulating layer 132 and may be disposed to overlap the electrode pad 166 in the vertical direction (Y-direction).

The cover layer 150 may prevent the electrode pad 166 or the like from being peeled off due to an interface IS of the bonding layer 160 or pores in the bonding layer 160, thereby improving reliability of the semiconductor device 10.

Specifically, in the semiconductor device 10, since the semiconductor structure 120 includes the stepped portion 129 at the outer surface thereof, the first insulating layer 131, the second conductive layer 146, and the second insulating layer 132, which are disposed below the semiconductor structure 120, may be disposed to correspond to the stepped portion 129 and thus may include a plurality of inclined surfaces I1, I2, and I3.

For example, the first insulating layer 131 may have a first inclined surface I1 including the outer surface of the second conductivity-type semiconductor layer 123 and the outer surface of the active layer 122 in the stepped portion 129. The second conductive layer 146 may have a second inclined surface I2 corresponding to the first inclined surface I1. The second insulating layer 132 may have a third inclined surface I3 corresponding to the second inclined surface I2. The inclined surfaces are formed along a step of the stepped portion 129. The present invention is not limited to the contents, and the first inclined surface I1, the second inclined surface I2, and the third inclined surface I3 may be formed to correspond to only one or more inclined surfaces.

The first inclined surface I1, the second inclined surface I2, and the third inclined surface I3 may be disposed at the outer portion of the semiconductor structure 120 in the stepped portion 129. Height differences h1, h2, and h3 of the first inclined surface I1, the second inclined surface I2, and the third inclined surface I3 may each be the same as a height difference of the stepped portion 129. Accordingly, when the bonding layer 160 is bonded to the substrate 170, an upper surface of a first bonding layer 160a has the same gradient as the inclined surface, and thus, pores may be generated in the interface IS between the first bonding layer 160a and the second bonding layer 160b due to a height difference according to a gradient in the bonding layer 160 formed by the first bonding layer 160a and a second bonding layer being coupled. In this case, the pores may be disposed to have various shapes and sizes in the interface IS inside the bonding layer 160. In addition, the pores may reduce a bonding force between the bonding layer 160 and with a plurality of layers (first conductive layer 165, second insulating layer 132, second conductive layer 146, electrode pad 166, and the like) positioned on the bonding layer 160. Accordingly, when pressure or the like is applied to the plurality of layers positioned on the bonding layer 160 or when the semiconductor device 10 is driven, heat may be generated, and due to a difference in thermal expansion coefficient between the semiconductor structure 120 and the plurality of layers (for example, a difference in thermal expansion coefficient between the substrate 170 and the semiconductor device 10), the plurality of layers may be peeled off.

Accordingly, reliability of the semiconductor device may be lowered. However, as described above, the cover layer 150 may be disposed between the first conductive layer 165 and the semiconductor structure 120 and on the bonding layer 160 to compensate for a height difference between a top surface and a bottom surface of the bonding layer 160 due to the stepped portion 129 and/or a step coverage. Thus, the cover layer 150 can prevent the pores from being generated in the interface IS and thus may prevent a phenomenon in which the electrode pad 166 is peeled off.

In addition, the cover layer 150 may include a metal material, for example, Au, Rb, Ag, or the like. However, the present invention is not limited thereto, and the cover layer 150 may be made of a material including an oxide or a nitride, such as an insulating material or a dielectric material. As described above, the electrode pad 166 may pass through the first insulating layer 131 to be disposed on the second conductive layer 146 and may have the electrical channel with the second conductive layer 146, the second reflective layer 145, and the second electrode 143. Thus, the electrode pad 166 may be electrically connected to the second conductivity-type semiconductor layer 123.

The electrode pad 166 may have a single-layer or multi-layer structure and may include at least one selected from among titanium (Ti), nickel (Ni), silver (Ag), and gold (Au). In an example, the electrode pad 166 may have a structure of Ti/Ni/Ti/Ni/Ti/Au.

The bonding layer 160 may include a conductive material. In an example, the bonding layer 160 may include a material selected from the group consisting of gold, tin, indium, aluminum, silicon, silver, nickel, and copper, or an alloy thereof. As described above, the bonding layer 160 may include the first bonding layer 160a and the second bonding layer 160b. The first bonding layer 160a may be disposed at an upper side of the bonding layer 160 to be in contact with the second insulating layer 132, and the second bonding layer 160b may be disposed at a lower side of the bonding layer 160 to be in contact with the substrate 170.

The substrate 170 may be disposed below the bonding layer 160 and may be made of a conductive material. In an example, the substrate 170 may include a metal or a semiconductor material. The substrate 170 may include a metal having high electrical conductivity and/or thermal conductivity. In this case, the substrate 170 can rapidly discharge heat, which is generated when the semiconductor device 10 operates, to the outside. In addition, when the substrate 170 is made of a conductive material, the first electrode 141 may receive a current from an external source through the substrate 170.

The passivation layer 180 may be disposed to surround an outer surface of the semiconductor device 10. Specifically, the passivation layer 180 may be disposed on upper surfaces of the semiconductor structure 120, the first insulating layer 131, and the electrode pad 166 and may be disposed to expose a portion of the electrode pad 166. Accordingly, the electrode pad 166 may be electrically connected to the outside through wire bonding or the like.

The passivation layer 180 may have a thickness ranging from 200 nm to 500 nm. When the thickness is 200 nm or more, a device can be protected from external moisture or foreign substances, thereby improving electrical and optical reliability of the device. When the thickness is 500 nm or less, it is possible to reduce stress applied to the semiconductor device 10, to prevent a decrease in optical electrical reliability of the semiconductor device 10, and to reduce costs of the semiconductor device 10, which are increased by an increase in a process time of the semiconductor device 10.

Uneven portions may be formed on the upper surface of the semiconductor structure 120. Such an uneven portion may improve extraction efficiency of light emitted from the semiconductor structure 120. The uneven portions may have different average heights based on an ultraviolet wavelength and may have various heights based on a peak wavelength of light emitted to the semiconductor structure 120. Accordingly, light extraction efficiency of the semiconductor device 10 can be improved.

FIG. 4 is a plan view illustrating the semiconductor structure, the first conductive layer, and the second conductive layer according to the embodiment, and FIG. 5 is a plan view illustrating the semiconductor structure, the cover layer, the second reflective layer, and the second conductive layer according to the embodiment.

Referring to FIG. 4, as described above, the first conductive layer 165 may be divided into the first region S1 and the second region S2 according to whether the regions overlap the semiconductor structure 120 in the vertical direction.

A ratio of an area of the first region S1 to an area of the second region S2 may be in a range of 1:0.27 to 1:0.62. Due to such a configuration, it is possible to improve current injection and light output efficiencies in the semiconductor device.

In particular, in the case of the semiconductor device 10 having high power, which is applied to indoor lighting, outdoor lighting, vehicles, and the like, in order to apply a high current, an area of the electrode pad 166 may be increased, and the electrode pad 166 may be disposed in the second region S2. In addition, when wires are disposed in the electrode pad 166, a plurality of wires may be disposed to apply a high current. In this case, an area of the electrode pad 166 needs to be secured for wire bonding. When the ratio of the area of the first region S1 to the area of the second region S2 is smaller than 1:0.27, there may be a problem in that, due to a decrease in size of the electrode pad, a current injection is reduced. In addition, as described above, an area, in which the plurality of wires are to be disposed, may not be secured. When the ratio of the area of the first region S1 to the area of the second region S2 is greater than 1:0.62, there may be a limitation in that an area of the semiconductor structure included in the semiconductor device 10 is small such as to reduce an emission area and thus an amount of emitted light is reduced.

The second conductive layer 146 may be disposed to overlap the first region S1 and the second region S2. Due to such a configuration, the second conductive layer 146 may extend to the outer surface of the semiconductor structure 120 to be electrically connected to the electrode pad 166 in the second region S2 and to be electrically connected to the semiconductor structure 120 in the first region S1. For example, the second conductive layer 146 may be electrically connected to the second conductivity-type semiconductor layer 123 of the semiconductor structure 120.

In addition, the second conductive layer 146 may include a plurality of holes h. The plurality of holes h may overlap the recesses 128 in the vertical direction. Accordingly, the second conductive layer 146 may be electrically opened from the first electrode 141 disposed in the recess 128.

Referring to FIG. 5, the cover layer 150 may be disposed in the second region S2. The cover layer 150 may not only be disposed in the second region S2 but may also extend to a partial region of the first region S1. Specifically, in the stepped portion 129, the lower surface of the first conductivity-type semiconductor layer 121 may be disposed to overlap the cover layer 150 in the vertical direction.

A ratio of an area S3 of the cover layer 150 to the area of the second region S2 may be in a range of 1:1.02 to 1:2.28.

When the ratio of the area S3 of the cover layer 150 to the area of the second region S2 is smaller than 1:1.02, an outer surface of the cover layer 150 may be positioned adjacent to the outer surface of the semiconductor device 10. Thus, there may be a problem in that it is difficult to secure a process margin of a process of arranging the cover layer 150. When the ratio of the area of the cover layer 150 to the area of the second region S2 is greater than 1:2.28, an area, in which pores of the bonding layer 160 are generated by the stepped portion 129, may not be sufficiently reduced, and thus, reliability of the semiconductor device 10 may be lowered. In addition, the holes h of the second conductive layer 146 may be disposed to surround the first reflective layer 147. That is, the hole h of the second conductive layer 146 may overlap the first reflective layer 147 in the vertical direction (Y-direction). Accordingly, the first reflective layer 147 may reflect light passing through the hole h of the second conductive layer 146, thereby improving light extraction efficiency.

FIG. 6 is a plan view illustrating the semiconductor structure, the electrode pad, the cover layer, and the second reflective layer according to the embodiment.

Referring to FIG. 6, the electrode pad 166 may overlap the cover layer 150 in the vertical direction (Y-direction). As described above, according to such a configuration, the cover layer 150 can prevent a peeling-off phenomenon due to the pores of the bonding layer 160 in response to a height difference of an upper surface of the bonding layer 160, which is caused by the stepped portion 129, thereby improving reliability of the semiconductor device 10.

Specifically, the electrode pad 166 may be disposed on the cover layer 150 and may be vertically overlap the cover layer 150. When the cover layer 150 and the electrode pad 166 vertically overlap each other, a ratio of an area S4 of the electrode pad 166 to the area S3 of the cover layer 150 may be in a range of 1:1.01 to 1:2.23.

When the ratio of the area S4 of the electrode pad 166 to the area S3 of the cover layer 150 is smaller than 1:1.01, there may be a limitation in that reliability is lowered due to pores in the bonding layer 160 below the electrode pad 166. Only when the electrode pad 166 should be disposed such that the ratio of the area S4 of the electrode pad 166 to the area S3 of the cover layer 150 is greater than 1:2.23, may a current be smoothly injected into the semiconductor device 10, and thus, electrical and optical characteristics of the semiconductor device 10 can be secured. In addition, when the plurality of wires are arranged, it is possible to secure an area in which the plurality of wires are to be disposed.

Furthermore, the electrode pad 166 may include a plurality of edges. For example, the electrode pad 166 may include first to fourth edges E1 to E4. The first edge E1 and the third edge E3 may be disposed to face each other, and the second edge E2 and the fourth edge E4 may also be disposed to face each other.

In addition, the second edge E2 may be disposed at an outermost side of the electrode pad 166 in a first-second direction (X2-direction), and the fourth edge E4 may be disposed at an outermost side of the electrode pad 166 in a first-first direction (X1-direction). The third edge E3 and the first edge E1 are disposed at an outermost side of the electrode pad 166 in a third-first direction (Z1-direction), and the third edge E3 may be disposed at an outermost side of the electrode pad 166 in a third-second direction (Z2-direction).

The cover layer 150 may have a shape in which the second edge E2 extends in the first-second direction (X2-direction), excluding the first edge E1, the third edge E3, and the fourth edge E4 of the electrode pad 166. That is, the cover layer 150 may extend toward a first stepped portion 129a of the stepped portion 129 disposed adjacent to the electrode pad 166. The stepped portion 129 may have various shapes according to a shape of the semiconductor structure 120. However, here, the stepped portion 129 may be divided into first to fourth stepped portions 129a to 129d according to positions. A surface of the stepped portion 129 closest to the electrode pad 166 is referred to as the first stepped portion 129a, and the rest thereof are referred to as the second to fourth stepped portions 129b, 129c, and 129d.

Accordingly, the cover layer 150 may be extend to be adjacent to the first stepped portion 129a, thereby compensating for a height difference of an inclined surface due to a stepped portion positioned between the semiconductor structure 120 and the electrode pad 166. Specifically, as described above, the stepped portion 129 is formed at the outer portion of the semiconductor device, and thus, a partial region of the first conductivity-type semiconductor layer 121 may be exposed. Accordingly, in the semiconductor structure 120, the outer surface of the second conductivity-type semiconductor layer, the outer surface of the active layer, and the lower surface of the first conductivity-type semiconductor layer may be exposed, and there may be a height difference between the lower surface of the second conductivity-type semiconductor layer and the exposed lower surface of the first conductivity-type semiconductor layer. The cover layer 150 compensates for the height difference, thereby reducing the size and/or number of pores of the bonding layer 160 disposed below the electrode pad 166.

A ratio of a maximum width L1 of the electrode pad 166 in the first direction (X-axis direction) to a maximum width L2 of the cover layer 150 in the first direction (X-axis direction) may be in a range of 1:1.17 to 1:2.64.

When the ratio of the maximum width L1 of the electrode pad 166 in the first direction (X-axis direction) to the maximum width L2 of the cover layer 150 in the first direction (X-axis direction) is smaller than 1:1.17, there may be a problem in that reliability of the semiconductor device is lowered due to pores generated in the bonding layer. When the ratio of the maximum width L1 of the electrode pad 166 in the first direction (X-axis direction) to the maximum width L2 of the cover layer 150 in the first direction (X-axis direction) is greater than 1:2.64, there is a limitation in that an emission region is reduced.

FIG. 7 is a modified example of FIG. 6.

Referring to FIG. 7, in the semiconductor device 10 according to the modified example, the cover layer 150 may have a size extending from first to fourth edges E1 to E4 of the electrode pad 166 in at least one direction of first-first and first-second directions (X1 and X2-directions) and third-first and third-second directions (Z1 and Z2-directions). Hereinafter, it will be described that the cover layer 150 has a shape which extends from all of the first to fourth edges E1 to E4 in the first-first and first-second directions (X1 and X2-directions) and the third-first and third-second directions (Z1 and Z2-directions).

Accordingly, the cover layer 150 may compensate for not only a height difference due to a gradient due to the stepped portion 129, but also a height difference due to a gradient of the second conductive layer 146. For example, as described above, since the semiconductor structure 120 includes the stepped portion 129, the semiconductor structure 120 may have the inclined surface I1 including the outer surface of the second conductivity-type semiconductor layer 123, the outer surface of the active layer 122, and a side surface of the first conductivity-type semiconductor layer 121. Since the second inclined surface I2 corresponds to the stepped portion 129, when a thickness of the first insulating layer 131 is constant, the second conductive layer 146 may also have a height difference due to the second inclined surface I2 along a step of the stepped portion 129 with respect to the first inclined surface I1. In this case, the cover layer 150 may be disposed below the second conductive layer 146 to compensate for the height difference. Due to such a configuration, in the semiconductor device 10 according to the modified example, pores may be prevented from being formed below the electrode pad 166 due to a stepped portion.

FIG. 8A is a cross-sectional view of a semiconductor device according to another embodiment, and FIG. 8B is a cross-sectional view of a semiconductor device according to still another embodiment.

Referring to FIG. 8A, in the semiconductor device according to another embodiment, a cover layer 150 may be disposed between a second insulating layer 132 and a second conductive layer 146 in the semiconductor device 10. The cover layer 150 may compensate for a height difference of an inclined surface disposed to correspond to a stepped portion 129 of the semiconductor structure 120. Specifically, since the semiconductor structure 120 includes the stepped portion 129, the semiconductor structure 120 may have an inclined surface I1 including an outer surface of a second conductivity-type semiconductor layer 123, an outer surface of an active layer 122, and a side surface of a first conductivity-type semiconductor layer 121. Since a second inclined surface I2 is formed along a step of the stepped portion 129, when a thickness of a first insulating layer 131 is constant, the second conductive layer 146 may also have a height difference due to the second inclined surface I2 along the step of the stepped portion 129 with respect to the first inclined surface I1. In this case, the cover layer 150 is disposed below the second conductive layer 146 to reduce the height difference.

Accordingly, the cover layer 150 may compensate for height differences of the first inclined surface I1 of the first insulating layer 131 and the second inclined surface I2 of the second cover layer 150. Thus, the second insulating layer 132 and the first cover layer 150, which are disposed below the cover layer 150, may have no inclined surface formed to correspond to the stepped portion 129, or even though the inclined surface is present, the inclined surface may have a height difference smaller than a height difference of the stepped portion 129. As a result, as described above, it is possible to prevent a phenomenon in which an electrode pad 166 is peeled off.

Referring to FIG. 8B, in a semiconductor device 10 according to still another embodiment, a cover layer 150 may be disposed between a second conductive layer 146 and a first insulating layer 131 in the semiconductor device 10. As described above, the cover layer 150 may compensate for a height difference of an inclined surface formed to correspond to a stepped portion 129 of the semiconductor structure 120. Specifically, since the semiconductor structure 120 includes the stepped portion 129, the semiconductor structure 120 may have a first inclined surface I1 including an outer surface of a second conductivity-type semiconductor layer 123, an outer surface of an active layer 122, and a side surface of a first conductivity-type semiconductor layer 121. When a thickness of the first insulating layer 131 is constant, the first insulating layer 131 may also have the same step along a step of the stepped portion 129 with respect to the first inclined surface I1. That is, a height difference between a bottom surface and a top surface of the first inclined surface I1 of the stepped portion 129 may remain the same in the first insulating layer 131. In this case, the cover layer 150 may be disposed below the first insulating layer 131 to reduce the height difference.

That is, in a semiconductor device according to still another embodiment, the cover layer 150 compensates for the height difference of the first inclined surface I1 of the first insulating layer 131, and thus, a second conductive layer 146, a second insulating layer 132, and a first cover layer 150, which are disposed below the cover layer 150, may have no inclined surface formed to correspond to the stepped portion 129, or even though the inclined surface is present, the inclined surface may have a height difference smaller than a height difference of the stepped portion 129. As a result, pores are prevented from being generated in a bonding layer 160 due to a height difference of an inclined surface, and thus, even when pressure is applied to an electrode pad 166, it is possible to prevent a phenomenon in which a layer (for example, the electrode pad) on the pores is peeled off.

In addition, in the present invention, a semiconductor device may also have a structure in which a cover layer is disposed in at least two of a position between a second insulating layer and a second conductive layer, between the second conductive layer and a first insulating layer, and between the second insulating layer and the first conductive layer.

FIG. 9 is a conceptual view of a semiconductor device package according to an embodiment of the present invention, and FIG. 10 is a plan view of the semiconductor device package according to the embodiment of the present invention.

Referring to FIG. 9, a semiconductor device 10 package may include a body 2 including a groove 3 (opening), a semiconductor device 10 disposed in the body 2, and a pair of lead frames 5a and 5b disposed in the body 2 and electrically connected to the semiconductor device 10. The semiconductor device 10 may include all of the above-described components.

The body 2 may include a material or a coating layer which reflects ultraviolet light. The body 2 may be formed by stacking a plurality of layers 2a, 2b, 2c, 2d, and 2e. The plurality of layers 2a, 2b, 2c, 2d, and 2e may include the same material or different materials. In an example, the plurality of layers 2a, 2b, 2c, 2d, and 2e may include an aluminum material.

The groove 3 may be formed to be wider as a distance from the semiconductor device 10 is increased, and a stepped portion 3a may be present on an inclined surface thereof.

A transparent layer 4 may cover the groove 3. The transparent layer 4 may be made of a glass material, but the present invention is not necessarily limited thereto. The transparent layer 4 is not particularly limited to a material as long as the material is capable of effectively transmitting ultraviolet light. The groove 3 may be empty.

Referring to FIG. 10, the semiconductor device 10 is disposed on a first lead frame 5a and may be connected to a second lead frame 5b by a wire 20. In this case, the second lead frame 5b may be disposed to surround a side surface of the first lead frame 5a.

FIGS. 11A to 11M are sequence diagrams for describing a method of manufacturing a semiconductor device according to an embodiment.

The method of manufacturing a semiconductor device according to the embodiment may include growing a semiconductor structure 120, arranging a recess 128 and a stepped portion 129, arranging a first insulating layer 131, a first electrode 141, and a second electrode 143, arranging a second reflective layer 145 and a second conductive layer 146, arranging a second insulating layer 132, arranging a cover layer 150, arranging a bonding layer 160, arranging a first conductive layer 165, and arranging passivation and an electrode pad 166.

First, referring to FIG. 11A, the semiconductor structure 120 may be grown. The semiconductor structure 120 may be grown on a first temporary substrate T. For example, a first conductivity-type semiconductor layer 121, an active layer 122, and a second conductivity-type semiconductor layer 123 may be grown on the first temporary substrate T.

The first temporary substrate T may be a growth substrate 170. For example, the first temporary substrate T may be made of at least one selected from among sapphire (Al2O3), SiC, GaAs, GaN, ZnO, Si, GaP, InP, and Ge, but the present invention is not limited to such a type.

In addition, the semiconductor structure 120 may be formed using, for example, a metal organic chemical vapor deposition (MOCVD) method, a chemical vapor deposition (CVD) method, a plasma enhanced chemical vapor deposition (PECVD) method, a molecular beam epitaxy (MBE) method, a hydride vapor phase epitaxy (HVPE) method, or the like, but the present invention is not limited thereto.

Descriptions of the first conductivity-type semiconductor layer 121, the active layer 122, and the second conductivity-type semiconductor layer 123 may be the same as described above.

Referring to FIG. 11B, the semiconductor device may have the recess 128 and the stepped portion 129. The recess 128 may pass through the second conductivity-type semiconductor layer 123 and the active layer 122 such that a partial region of the first conductivity-type semiconductor layer 121 is exposed. Similarly to the recess 128, the stepped portion 129 may pass through the second conductivity-type semiconductor layer 123 and the active layer 122 such that a partial region of the first conductivity-type semiconductor layer 121 is exposed. The stepped portion 129 may be continuously disposed to be spaced apart from a side surface of the semiconductor structure 120. For example, the stepped portion 129 may include an outer surface of the second conductivity-type semiconductor layer 123, an outer surface of the active layer 122, and an exposed lower surface of the first conductivity-type semiconductor layer 121.

Specifically, as described above, when a process margin for removing only the second conductivity-type semiconductor layer 123 and the active layer 122 is possible, the stepped portion 129 may be formed of the outer surface of the second conductivity-type semiconductor layer 123, the outer surface of the active layer 122, and the lower surface of the first conductivity-type semiconductor layer 121. That is, the lower surface of the first conductivity-type semiconductor layer 121 may be the same surface that is in contact with an upper surface of the active layer 122.

However, when a process margin for arranging the stepped portion 129 is taken into account, the stepped portion 129 may further include not only the exposed lower surface of the first conductivity-type semiconductor layer 121 but also an inclined surface of the first conductivity-type semiconductor layer 121, which is a portion of a first inclined surface.

In addition, the stepped portion 129 may be formed concurrently with the recess 128 through etching. Thus, processes can be minimized. In addition, as described above, the recess 128 and the stepped portion 129 may have the same inclination angle and the same thickness in a vertical direction.

Referring to FIG. 11C, the first insulating layer 131 may be disposed on an upper surface of the semiconductor structure 120. The first insulating layer 131 may be removed from a position of the first insulating layer 131, at which the first electrode 141 and the second electrode 143 are disposed. Specifically, the first insulating layer 131 may be etched such that the first conductivity-type semiconductor layer 121 is exposed in the recess 128. Similarly, the first insulating layer 131 may be etched such that the second conductivity-type semiconductor layer 123 is exposed.

Referring to FIG. 11D, the first electrode 141 and the second electrode 143 may be disposed. The second electrode 143 may be disposed on the second conductivity-type semiconductor layer 123 exposed by the first insulating layer 131, and a portion of the second electrode 143 may be disposed on the first insulating layer 131. The first electrode 141 may be disposed in the recess 128 to be in contact with the exposed first conductivity-type semiconductor layer 121. However, the present invention is not limited thereto, and an arrangement order may be variously applied. In addition, the second electrode 143 may be disposed, and the second reflective layer 145 may be disposed on the second electrode 143. The second electrode 143 and the second reflective layer 145 have an area that is greater than an area of the second conductivity-type semiconductor layer 123 exposed by etching the first insulating layer 131, thereby improving current spreading and light reflection.

Referring to FIG. 11E, the second conductive layer 146 may be disposed on an upper surface of the first insulating layer 131. Accordingly, the first insulating layer 131 may electrically insulate the second conductive layer 146 and the first conductivity-type semiconductor layer 121 from each other. The second conductive layer 146 may be electrically connected to the second electrode 143 and thus may have an electrical channel. In addition, the second conductive layer 146 may be etched so as to not be exposed at an outer surface of the semiconductor device 10.

Referring to FIG. 11F, the second insulating layer 132 may be disposed on the semiconductor structure 120. The second insulating layer 132 may be positioned on the second conductive layer 146, the first insulating layer 131, the second reflective layer 145, the second electrode 143, and the first electrode 141 and may be disposed to surround the second conductive layer 146, the first insulating layer 131, the second reflective layer 145, the second electrode 143, and the first electrode 141. In addition, the second insulating layer 132 may be disposed on the first insulating layer 131. Even though cracks are generated in the first insulating layer 131, the second insulating layer 132 may secondarily protect the semiconductor structure 120. The second insulating layer 132 may be disposed to expose a portion of an upper surface of the first electrode 141. For example, the second insulating layer 132 may be perforated on a portion of the upper surface of the first electrode 141. The second insulating layer 132 may electrically insulate the second electrode 143 and the first conductive layer 165 from each other.

Referring to FIG. 11G, the cover layer 150 may be disposed on the second insulating layer 132. As described above, the cover layer 150 may compensate for height differences of inclined surfaces of a plurality of layers formed by the stepped portion 129. Specifically, when each of components, i.e., each of the first insulating layer 131, the second conductive layer 146, and the second insulating layer 132, which are disposed on the semiconductor structure 120, has a constant thickness, the first insulating layer 131, the second conductive layer 146, and the second insulating layer 132 may have inclined surfaces having the same height as the stepped portion 129 along a step of the stepped portion 129.

In addition, the first reflective layer 147 may be disposed on the first electrode 141 to be electrically connected to the first electrode 141. A portion of the first reflective layer 147 may be disposed on the second insulating layer 132. The first reflective layer 147 may be disposed through the same process as the cover layer 150. Thus, a manufacturing process can be simplified. However, the present invention is not limited to such a method.

Referring to FIG. 11H, the first conductive layer 165 may be disposed on the exposed upper surface of the first electrode 141. Accordingly, the first conductive layer 165 may be electrically connected to the first reflective layer 147 so that the first conductive layer 165, the first electrode 141, and the first reflective layer 147 may have an electrical channel. A first bonding layer 160a may be disposed on the first conductive layer 165.

Referring to FIG. 11I, the first bonding layer 160a may be disposed on the first conductive layer 165, and a second bonding layer 160b may be disposed below the substrate 170. The first bonding layer 160a and the second bonding layer 160b may be coupled to each other at a predetermined temperature and pressure. In this case, an upper surface of the first bonding layer 160a and a lower surface of the second bonding layer 160b may be in contact with each other, and the lower surface of the second bonding layer 160b may be flat. Alternatively, the first bonding layer 160a may have an upper surface having the same shape as an upper surface of the first conductive layer 165, and thus, the upper surface of the first bonding layer 160a may have a height difference.

In addition, the cover layer 150 can prevent an inclined surface corresponding to the stepped portion 129 from being formed on the upper surface of the first bonding layer 160a. That is, the cover layer 150 may allow a flat surface or an inclined surface having a height difference smaller than a height difference of the stepped portion 129 to be disposed on the upper surface of the first bonding layer 160a along the step of the stepped portion 129. Thus, when the first bonding layer 160a is coupled to the second bonding layer 160b, pores can be prevented from being generated due to a height difference between the lower surface of the second bonding layer 160b and the upper surface of the first bonding layer 160a. Therefore, as described above, the cover layer 150 can prevent pores from being generated in an interface IS between the first bonding layer 160a and the second bonding layer 160b.

The bonding layer 160 may include a conductive material. For example, the bonding layer 160 may include a material selected from the group consisting of gold, tin, indium, aluminum, silicon, silver, nickel, and copper, or an alloy thereof.

In addition, the substrate 170 may be disposed on the second bonding layer 160b. Accordingly, as described with reference to FIG. 1, the substrate 170 may be made of a conductive material. In an example, the substrate 170 may include a metal or a semiconductor material. The substrate 170 may include a metal having high electrical conductivity and/or thermal conductivity. In this case, heat generated when the semiconductor device 10 operates can be rapidly discharged to the outside. In addition, when the substrate 170 is made of a conductive material, the first electrode 141 may receive a current from an external source through the substrate 170.

The substrate 170 may include a material selected from the group consisting of silicon, molybdenum, silicon, tungsten, copper, and aluminum, or an alloy thereof.

Referring to FIG. 11K, the first temporary substrate T may be separated from the semiconductor structure 120. For example, the semiconductor structure 120 and the first temporary substrate T may be separated by irradiating a laser onto the first temporary substrate T. However, the present invention is not limited to such a method.

Referring to FIG. 11L, patterns may be present by etching the first conductivity-type semiconductor layer 121 in some regions of the semiconductor structure 120. The first insulating layer 131 may be etched such that the second conductive layer 146 is exposed in an etched region. The electrode pad 166 may be disposed in a hole.

In addition, the passivation layer 180 may be disposed on the upper and side surfaces of the semiconductor structure 120. As described above, the passivation layer 180 may have a thickness ranging from 200 nm to 500 nm. When the thickness is 200 nm or more, a device can be protected from external moisture or foreign substances, thereby improving electrical and optical reliability of the device. When the thickness is 500 nm or less, it is possible to reduce stress applied to the semiconductor device 10, to prevent a decrease in optical electrical reliability of the semiconductor device 10, and to reduce costs of the semiconductor device 10, which are increased by an increase in a process time of the semiconductor device 10. However, the present invention is not limited to such a configuration.

In addition, before the passivation layer 180 is disposed, uneven portions may be formed on an upper surface of the semiconductor structure 120. The uneven portions may improve extraction efficiency of light emitted from the semiconductor structure 120. Heights of the uneven portions may be differently adjusted according to a wavelength of light generated in the semiconductor structure 120.

As described above with reference to FIG. 9, the semiconductor structure may be disposed on a lead frame of a semiconductor device package or a circuit pattern of a circuit board. The semiconductor device may be applied to various kinds of light source devices. In an example, the light source devices may include a sterilizing device, a curing device, a lighting device, a display device, a vehicle lamp, and the like. That is, the semiconductor device may be disposed in a case to be applied to various electronic devices which provide light.

The sterilizing device may include the semiconductor device according to the embodiment to sterilize a desired region. The sterilizing device may be applied to household appliances such as a water purifier, an air conditioner, and a refrigerator, but the present invention is not necessarily limited thereto. That is, the sterilizing device may be applied to all various products (for example, medical devices) requiring sterilization.

In an example, the water purifier may include the sterilizing device according to an embodiment so as to sterilize circulating water. The sterilizing device may be disposed in a nozzle or an ejection port through which water circulates and may irradiate ultraviolet light. In this case, the sterilizing device may have a waterproof structure.

The curing device may include the semiconductor device according to the embodiment to cure various liquids. The liquid may be the broadest concept that includes various materials which cure upon exposure to ultraviolet light. In an example, the curing device may cure various resins. Alternatively, the curing device may be applied to cure a cosmetic product such as a manicure.

The lighting device may include a substrate, a light source module including the semiconductor device according to the embodiment, a heat dissipater for dissipating heat of the light source module, and a power supply for processing or converting an electrical signal supplied from the outside and supplying the processed or converted electrical signal to the light source module. In addition, the lighting device may include a lamp, a head lamp, a street lamp, or the like.

The display device may include a bottom cover, a reflective plate, a light-emitting module, a light guide plate, an optical sheet, a display panel, an image signal output circuit, and a color filter. The bottom cover, the reflective plate, the light-emitting module, the light guide plate, and the optical sheet may constitute a backlight unit.

The reflective plate is disposed on the bottom cover, and the light-emitting module emits light. The light guide plate is disposed in front of the reflective plate and guides light emitted from the light-emitting module in a forward direction, and the optical sheet includes a prism sheet and the like and is disposed in front of the light guide plate. The display panel is disposed in front of the optical sheet, the image signal output circuit supplies an image signal to the display panel, and the color filter is disposed in front of the display panel.

When the semiconductor device is used as a backlight unit of a display device, the semiconductor device may be used as an edge-type backlight unit or as a direct-type backlight unit.

The semiconductor device may be a laser diode in addition to a light-emitting diode described above.

Like a light-emitting device, the laser diode may include a first conductivity-type semiconductor layer, an active layer, and a second conductivity-type semiconductor layer which have the above-described structure. Furthermore, the laser diode uses an electro-luminescence phenomenon in which light is emitted when a current flows therein after a p-type first conductivity-type semiconductor and an n-type second conductivity-type semiconductor are bonded, but the laser diode has directivity and a phase of light different from those of light emitted from the light-emitting device. That is, the laser diode may emit light having the same phase in the same direction at a specific single wavelength (i.e., a monochromatic beam) using a phenomenon referred to as stimulated emission and a constructive interference phenomenon, and, with the above-described characteristic, the laser diode may be used for optical communication, medical equipment, semiconductor processing equipment, and the like.

As an example of a light-receiving device, there is a photodetector, which is a kind of a transducer which detects light and converts intensity of the light into an electric signal. As the photodetector, there is a photovoltaic cell (silicon and selenium), an optical conversion device (cadmium sulfide and cadmium selenide), a photo diode (PD) (e.g., a PD having a peak wavelength in a visible blind spectral region or a true blind spectral region), a phototransistor, a photomultiplier tube, a phototube (e.g., a vacuum and gas-filled type), an infra-red (IR) detector, and the like, but the embodiments are not limited thereto.

Furthermore, a semiconductor device such as the photodetector may be manufactured using a direct bandgap semiconductor which generally has superior photo-conversion efficiency. Alternatively, the photodetector may have a variety of structures, including a pin-type photodetector using a p-n junction, which is the most general structure, a Schottky photodetector using a Schottky junction, and a metal-semiconductor-metal (MSM) type photodetector.

Like the light-emitting device, the PD may include a first conductivity-type semiconductor layer, an active layer, and a second conductivity-type semiconductor layer which have the above-described structure, and the PD may be configured with a p-n junction or a pin structure. The PD is operated by applying a reverse bias or a zero bias, and, when light enters the PD, electrons and holes are generated such that a current flows. At this point, a magnitude of the current may be approximately proportional to intensity of the light which is incident on the PD.

A photovoltaic cell or a solar cell is a kind of PD and may convert light into a current. Like the light-emitting device, the solar cell may include a first conductivity-type semiconductor layer, an active layer, and a second conductivity-type semiconductor layer which have the above-described structure.

Further, the PD may be used as a rectifier of an electronic circuit through a rectifying characteristic of a general diode using a p-n junction, and the PD may be applied to an oscillation circuit and the like by being employed as a microwave circuit.

In addition, the above-described semiconductor device is not necessarily implemented with only a semiconductor and may further include a metal material in some cases. For example, the semiconductor device such as the light-receiving device may be implemented using at least one selected from among Ag, Al, Au, In, Ga, N, Zn, Se, P, and As, or may be implemented using a semiconductor material which is doped with a p-type or n-type dopant or an intrinsic semiconductor material.

While the present invention has been mainly described with reference to the embodiments, and it should be understood that the present invention is not limited to the disclosed embodiments, and that various modifications and applications can be devised by those skilled in the art without departing from the gist of the present invention. For example, each component specifically shown in the embodiment may be modified and implemented. Differences related to these modifications and applications should be construed as being within the scope of the present invention defined by the appended claims.

The invention claimed is:

1. A semiconductor device comprising:
   a substrate;
   a semiconductor structure disposed on the substrate and including a first conductivity-type semiconductor layer, a second conductivity-type semiconductor layer, and an active layer disposed between the first conductivity-type semiconductor layer and the second conductivity-type semiconductor layer;
   a bonding layer disposed between the semiconductor structure and the substrate;
   a cover layer disposed between the bonding layer and the semiconductor structure; and
   an electrode pad disposed on the cover layer and spaced apart from the semiconductor structure,
   wherein the semiconductor structure further includes a stepped portion at which a side surface of the second conductivity-type semiconductor layer, a side surface of the active layer, and a lower side surface of the first conductivity-type semiconductor layer are inclined, and
   wherein the cover layer extends from a region vertically overlapping the electrode pad to a region vertically overlapping a partial region of the first conductivity-type semiconductor and without overlapping the second conductivity-type semiconductor layer.

2. The semiconductor device of claim 1, further comprising:
   a first conductive layer electrically connected to the first conductivity-type semiconductor layer; and
   a second conductive layer electrically connected to the second conductivity-type semiconductor layer,
   wherein the bonding layer is disposed between the first conductive layer and the substrate, and
   wherein the second conductive layer is disposed between the first conductive layer and the semiconductor structure and between the electrode pad and the first conductive layer.

3. The semiconductor device of claim 2, wherein the electrode pad is spaced apart from the semiconductor structure, and
   wherein the semiconductor device further includes a first insulating layer disposed between the semiconductor structure and the second conductive layer, and a second insulating layer disposed between the second conductive layer and the first conductive layer.

4. The semiconductor device of claim 3, wherein the cover layer is disposed between the first conductive layer and the second insulating layer or between the second insulating layer and the second conductive layer.

5. The semiconductor device of claim 2, wherein the electrode pad overlaps the cover layer in a vertical direction.

6. The semiconductor device of claim 1, wherein the stepped portion is disposed at an outer edge portion of the semiconductor structure.

7. The semiconductor device of claim 6, wherein a length ratio of a minimum length of the stepped portion to a length of the cover layer in a vertical direction is in a range of 1:0.2 to 1:1.5.

8. The semiconductor device of claim 6, wherein the cover layer extends toward the semiconductor structure.

9. The semiconductor device of claim 8, wherein the cover layer includes an inclined surface corresponding to an inclined surface of the stepped portion.

10. The semiconductor device of claim 9, wherein a minimum length of the inclined surface of the cover layer in a vertical direction is the same as a minimum length of the inclined surface of the stepped portion in the vertical direction.

11. The semiconductor device of claim 1, wherein the stepped portion is formed at an outer portion of the semiconductor structure and passes through the second conductivity-type semiconductor layer and the active layer.

12. The semiconductor device of claim 11, wherein the stepped portion is formed at an outer portion of the semiconductor structure and passes through a partial region of the first conductivity-type semiconductor layer.

13. The semiconductor device of claim 1, wherein the semiconductor structure includes a recess passing through the second conductivity-type semiconductor layer and the active layer and to expose a partial region of the first conductivity-type semiconductor layer.

14. The semiconductor device of claim 13, wherein the stepped portion is disposed to surround the recess.

15. The semiconductor device of claim 3, wherein the first insulating layer, the second conductive layer, and the second insulating layer are disposed to correspond to the stepped portion and include a plurality of inclined surfaces.

16. The semiconductor device of claim 15, wherein the first insulating layer has a first inclined surface including an outer surface of the second conductivity-type semiconductor layer and an outer surface of the active layer in the stepped portion.

17. The semiconductor device of claim 16, wherein the second conductive layer has a second inclined surface corresponding to the first inclined surface.

18. The semiconductor device of claim 17, wherein the second insulating layer has a third inclined surface corresponding to the second inclined surface.

19. The semiconductor device of claim 18, wherein the first inclined surface, the second inclined surface, and the third inclined surface have a same inclination.

20. The semiconductor device of claim 19, wherein a height of the first inclined surface, the second inclined surface, and the third inclined surface are the same as a height of the stepped portion.

* * * * *